United States Patent [19]

Sokal et al.

[11] 3,919,656

[45] Nov. 11, 1975

[54] HIGH-EFFICIENCY TUNED SWITCHING POWER AMPLIFIER

[76] Inventors: Nathan O. Sokal; Alan D. Sokal, both of 4 Tyler Road, Lexington, Mass. 02173

[22] Filed: Apr. 23, 1973

[21] Appl. No.: 353,588

[52] U.S. Cl. .................... 330/51; 330/31; 330/192

[51] Int. Cl.[2] .................... H03F 1/14

[58] Field of Search .................... 330/192, 207 A, 31; 307/297, 243

[56] References Cited

UNITED STATES PATENTS

| | | | |
|---|---|---|---|
| 3,430,157 | 2/1969 | Wood | 330/192 |
| 3,437,931 | 4/1969 | Schultz, Jr. | 330/192 X |

FOREIGN PATENTS OR APPLICATIONS

| | | | |
|---|---|---|---|
| 863,463 | 2/1971 | Canada | 330/207 A |

OTHER PUBLICATIONS

Electronic Design, Mar. 1966, pp. 35–40 (38–43), "Lohrmann".

IEEE Transactions, Dec., 1967, Vol. ED-14, No. 12, pp. 851–857, "Snider".

Radio Electronics, July 1965, pp. 54, 55, "Crowhurst", The Two-State Amplifier.

*Primary Examiner*—Nathan Kaufman
*Attorney, Agent, or Firm*—Wolf, Greenfield & Sacks

[57] ABSTRACT

A high efficiency tuned switching power amplifier employs an active device switch driven at a frequency determined by an a.c. input signal. The active device switch controls the application of direct current power to a load through a resonant load network. The load network is substantially nonresistive and its resonance minimizes power loss by insuring that in the transition of the switch from "on" to "off," the voltage across the switch remains low (viz. substantially zero) until the current through the switch has fallen to zero (viz. current flow ceases). The network, in addition, insures that the voltage across the switch is zero at the end of the "off" state so that current flow through the switch recommences when there is substantially zero voltage across the switch and that that voltage remains substantially zero while current flow through the switch continues. The network further causes the voltage waveform across the switch to have zero or nearly zero time derivative at the end of the "off" state.

10 Claims, 14 Drawing Figures

HIGH-EFFICIENCY TUNED SWITCHING POWER AMPLIFIER

TABLE OF CONTENTS

FIELD OF THE INVENTION
I. PRINCIPLES FOR OBTAINING HIGH EFFICIENCY
II. PRIOR ART USING CURRENT-SOURCE ACTIVE DEVICES
A. Tuned Class C Amplifier B. Multiple-Resonator Tuned Amplifier
C. Limitations of Prior-Art Current-Source Circuits
III. PRIOR ART USING SWITCHING-MODE ACTIVE DEVICES
A. Reason for Using Switches Instead of Current Sources
B. Prior-Art Circuits Using a Pair of Switches
C. Prior-Art Circuits Using a Single Switch
D. Prior-Art Current-Source Circuits in Which the Current Source May Accidentally Be Allowed to Saturate
IV. NEW APPROACH TAKEN FOR THE PRESENT INVENTION
V. DESCRIPTION OF THE INVENTION
A. General Principles of the Present Invention
B. Description of Rudimentary Embodiment of the Invention
C. Performance Equations
D. Element Values
E. Impedance Transformation and Capacitance Neutralization
F. Tuning
1. L2 Fixed, C1 and C2 Tune
2. Single Variable Element
3. Tuning by Varying Switch Duty Ratio
4. Tuning a Load Which Is Not Substantially a Constant R,L,C
5. Combinations of Tuning Methods
G. Modulation
H. Power Oscillator

FIELD OF THE INVENTION

This invention relates in general to tuned power amplifiers; in particular, it discloses improved switching-mode tuned power amplifiers. The invention provides tuned power amplification of ac signals with higher efficiency and/or more power output and/or greater reliability in operation than are attained in prior-art power amplifier circuits employing comparable active devices (e.g. transistors or vacuum tubes).

I. PRINCIPLES FOR OBTAINING HIGH EFFICIENCY

High efficiency in a power amplifier is desirable in applications in which any of the following are important; (1) for the equipment: low power consumption, low temperature rise, high reliability, small size, light weight, or low cost, or (2) for the batteries used with battery-operated equipment: long life, small size, light weight or low cost. These desirable characteristics result from the small amount of power which is wasted in the form of heat, which heat must then be exhausted from the equipment via heat-transfer means such as heat sinks or air-blowers. In a high-efficiency amplifier, increases of efficiency which at first might appear to be minor can, in fact, be of major importance. For example, increasing an amplifier collector efficiency from 80 to 90% results in a factor of two reduction of collector power dissipation (from 20% of the input power to 10%). If the collector power dissipation is the limiting factor on amplifier performance, that improvement of efficiency from 80 to 90% allows a doubling of amplifier power output capability for the given output transistor and heat sink. Or, if the power output capability is kept the same as before, the increased efficiency results in a halving of the transistor internal temperature rise above the ambient temperature, with a consequent substantial increase in reliability.

In order to maximize the efficiency of a power amplifier, the loss of energy to anything other than the output load must be minimized. The usual considerations apply regarding the need for low parasitic losses in insulating and conducting materials near the power output stage and for high unloaded Q in the reactive tuning and impedance-transforming components. Special considerations, different from those for the reactive components, apply to the output active device(s), e.g. transistors or vacuum tubes. The active devices usually have no appreciable energy storage capability aside from their incidental capacitances and inductances; such reactances can effectively be absorbed into the tuned circuits. All energy delivered to such an active device, other than that used in placing charge on its capacitances or in building up current in its inductances, is converted to heat, using input power without delivering ac power to the load. This reduces the power efficiency of the amplifier. In fact, a major source of energy loss in power amplifier circuits is usually the power dissipation in the output active device(s).

The mathematical meaning of minimizing the energy loss to a circuit element which does not store appreciable energy is to minimize the time-integral value of the instantaneous product of the voltage across the element and the current through the element. Thus, to attain minimum energy losses to such a circuit element, it is necessary to:

a. minimize the voltage across the element when appreciable current flows through it,
b. minimize the current flowing through the element when appreciable voltage exists across it, and
c. minimize the duration of any unavoidable condition in which appreciable current flow and appreciable voltage exist simultaneously.

An ideal switch causes all these requirements to be met; the application of a real switch (e.g. a transistor or a vacuum tube, operated in the switching mode) can approach the ideal if the circuit incorporating the switch is designed properly. The switching-mode amplifier circuits described herein approach this ideal mode of operation more closely than do prior art amplifier circuits.

In order that the novel features of the present invention may be more readily appreciated, the state of "prior art" tuned power amplifiers will first be briefly reviewed.

II. PRIOR ART USING CURRENT-SOURCE ACTIVE DEVICES

A. Tuned Class C Amplifier

Prior art tuned power amplifiers of the tuned Class C type are described in the following technical literature: F. E. Terman, *Radio Engineering*, 3rd Edition, pp. 374–393; M. R. Osborne, "Design of Tuned Transistor Power Amplifiers", *Electronic Engineering*, *August*, 1968, pp. 436–433; R. G. Harrison, "A Nonlinear Theory of Class C Transistor Amplifiers and Frequency Multipliers," *IEEE Journal of Solid State Circuits*, Vol. SC-2, No. 3, September, 1967, pp. 93–102; and J. A. G. Slatter, "An Approach to the Design of Transistor Tuned Power Amplifiers", *IEEE Trans. Circuit Theory*, *Vol. CT*-12, No. 2, June, 1965, pp. 206–211. In the tuned Class C amplifier, the output active device is effectively a high-impedance current source. That is, exclusive of its incidental reactances (which can be absorbed into the tuned circuits), it is a two-port device which supplies at its output port a current which is (1) determined primarily by the drive signal applied to its input port and (2) substantially independent of the output-port voltage which results from the flow of that current in the output load network. (In some cases the input and output ports of the active device may be the same; that is, the device is a two-terminal device such as a diode which displays negative-resistance characteristics.) Hereafter, the term "the current source" is used to denote the output port of an active device which acts substantially as a high-impedance current source as described above. In the tuned Class C amplifier, the current source provides substantially zero current for most (at least half) of the ac cycle, and for the remainder of the cycle (typically 10%) it provides a pulse of current, typically a truncated sinusoid. The load circuit is a parallel-tuned tank, resonant at the output frequency, across which the output load is connected, or is an equivalent thereof. The load circuit is so designed that its voltage response to the periodic pulses of current from the current source is substantially a sinusoid at the output frequency, with the following properties: (1) the minimum of the voltage across the current source occurs at the time of the current pulse from the current source, and (2) at the time of said minimum, the voltage across the current source is not less than a certain minimum permissible voltage determined by the nature of the particular active device being used. This minimum permissible voltage across the current-source active device is necessary, for all presently known active devices, in order for the device to function properly as the high-impedance current source needed for operation as intended in the Class C circuit. This minimum permissible voltage prevents "saturation" of a transistor or "bottoming" of a pentode vacuum tube, for example.

Moderately high efficiency is obtained because (1) the voltage waveform has its minimum at the time of the current pulse, and this minimum voltage is moderately low (thus partially meeting condition (*a*) of Section I above), (2) the active device has substantially zero current during the remainder of the ac cycle (thus meeting condition (*b*) of Section I above), and (3) the duration of the current pulse is made only a small fraction of the ac cycle in order that there not be appreciable current at times substantially removed from that of the minimum of the voltage sinusoid, i.e. times at which the voltage across the active device is no longer low (thus meeting condition (*c*) of Section I above). However, since a substantial minimum permissible voltage is required across the active device during the current pulse, a significant amount of power is dissipated during the current pulse, thereby resulting in a loss of efficiency. Moreover, the restriction on current pulse duration is wasteful of active device power output capability, since increased power output may be obtained by using a wider current pulse, at a sacrifice of efficiency. A compromise between efficiency and power output (as well as other factors to be discussed in Section II. C below) is therefore required; this compromise is an inherent limitation and disadvantage of the Class C amplifier.

B. Multiple-Resonator Tuned Amplifier

A modified version of the Class C amplifier, sometimes employed in the prior art, is described by V. J. Tyler, "A New High Efficiency High Power Amplifier", *Marconi Review*, Vol. 21, pp. 96–109, 1958; N. S. Fuzik, "Biharmonic Modes of a Tuned RF Power Amplifier", *Radio Engineering*, Vol. 25, No. 7, pp. 117–124, 1970; N. S. Fuzik, E. A. Sadykov and V. I. Serguchev, "Electrical Design of the Oscillatory Circuits of the Final State of a Radio Transmitter Operating in the Biharmonic Mode", *Radio Engineering*, Vol. 25, No. 1, pp. 141–145, 1970; and J. W. Wood, "High Efficiency Class C Amplifier", U.S. Pat. No. 3,430,157, Nov. 10, 1966. In this amplifier the output active device acts, as before, as a high-impedance pulsed current source, but the load circuit is modified by the addition of one or more harmonic resonators in series with the fundamental-frequency resonator. This load circuit is designed to provide a relatively flat-bottomed voltage waveform when driven by the pulsed current source, thereby extending the duration of the low-voltage condition and hence permitting the use of a wider current pulse without the severe loss of efficiency which would have occurred in the original Class C circuit. The requirement that at least a certain minimum permissible voltage exist at all times across the current-source active device applies to this circuit also. The approximation to the flat-bottomed voltage waveform is obtained by designing the fundamental-frequency resonant circuit and the harmonic-frequency resonant circuit(s) such that their voltage waveforms, in response to the current pulses delivered by the current-source active device, have the proper frequencies, magnitudes and phases so that, when added arithmetically, two conditions are met: (1) the voltage across the current-source active device is substantially a flat-bottomed waveform for as close to half of the ac cycle as can be obtained, and (2) at its minimum peak, this voltage is not less than the minimum permissible voltage across the current-source active device. The ability to use a wider current pulse, for a given efficiency, leads to more power output from a given active device than would be obtained from the original Class C circuit.

In D. M. Snider's "A Theoretical Analysis and Experimental Confirmation of the Optimally Loaded and Overdriven RF Power Amplifier", *IEEE Trans. Electron Devices*, Vol. ED-14, No. 12, December 1967, pp. 851–857, an idealized "optimum efficiency Class B" amplifier is analyzed which is similar in concenpt to that of Tyler, Fuzik et al, and Wood (op. cit.). Snider hypothesizes a load network whose voltage response is a square wave of 50% duty ratio and zero rise and fall times, when driven by a Class B sinusoidal current source, i.e. one which delivers half-sine pulses of current. The square wave has the flat-bottomed shape desired by Tyler et al and makes it transitions when the current wave passes through zero. According to Snider, the input-port impedance required of this hypothesized network is a specified resistance at the fundamental frequency, zero impedance at all even-harmonic frequencies, and infinite impedance at all odd-harmonic frequencies. Snider derives a theoretical efficiency of 100% for this idealized amplifier; the absence of any losses results from his assumptions that (1) the voltage response of the load network provides exactly zero voltage across the current source during the entire half-cycle in which the current source is delivering its half-sinewave of current, (2) the current source operates as assumed with this zero voltage, and (3) the voltage square-wave makes its rising and falling transitions in zero time, just as the current delivered by the current source decreases to zero or starts to increase from zero, respectively. Snider defines his load network in terms of its impedance at the fundamental and all harmonic frequencies, but does not consider specific L or C values or circuit loaded Q ($Q_L$) needed to approximate this ideal in any specific sense.

C. Limitations of Prior Art Current-Source Circuits

Both the original Class C amplifier and the improved versions with wider current-source conduction angle are subject to substantial power dissipation in the active device during the current pulse. This is because the voltage across the active device at that time must be kept larger than the minimum permissible value discussed above, typically of the order of 10% of the dc supply voltage. For both types of amplifiers, obtaining high efficiency thus requires that the drive and load circuits be adjusted carefully so as to obtain an ac output voltage amplitude which is (1) large enough to bring the active-device voltage as close to zero as allowable during the current pulse, but (2) not so large as to cause the device voltage to become less than the minimum permissible voltage, and thereby cause the device to lose its property of being a high-impedance current source. Such adjustment may be undesirably complicated and is likely to be critical with respect to changes in load impedance, operating frequency, input drive and dc supply voltage. Moreover, if the output signal amplitude is misadjusted in the direction of being too large, the active device may be placed in a potentially-destructive operating mode: for the vacuum tube, the anode may become excessively negative with respect to the screen grid and/or control grid and/or cathode (inverted mode); for the transistor (npn taken as an example), the collector may become negative with respect to the emitter (inverted mode).

The adjustment for proper output-port signal amplitude must maintain the proper relationships among the following variables: output-port dc supply voltage (e.g. collector or anode supply in the cases of transistors or vacuum tubes), other electrode (e.g. screen) dc supply voltage (if used), load resistance, tank element reactances, input-port (e.g. base-emitter or grid-cathode) dc bias and ac drive amplitude, and the resonant frequencies and impedances of the plurality of resonators, if used, to assure that the fundamental and harmonic voltages add up in the proper magnitudes and phases to obtain the desired approximation of the flatbottomed voltage wave. Thus a tradeoff must be made among efficiency, exploitation of the potential power-output capability of the active device, and the methods and precision of adjusting the above-listed circuit parameters to achieve the desired adequate, but not excessive, voltage across the active device during the current pulse.

III. PRIOR ART USING SWITCHING-MODE ACTIVE DEVICES

A. Reason for Using Switches Instead of Current Sources

Higher efficiency can be achieved by using the active device as a two-state switch rather than as a high-impedance current source. In this mode, the operation of the active device approaches that of a short-circuit when the switch is on and of an open-circuit when the switch is off. That is, exclusive of its incidental reactances, which can be absorbed into the tuned circuits, the switching-mode active device provides at its output port, determined primarily by the control signal at its input port:

1. in the on state, a very low impedance, i.e. substantially zero voltage across itself, substantially independent of the load network connected to its output port and of the current through the switch which results from the successive application of the switch on and off states to that load network, and
2. in the off state, a very high impedance, i.e. substantially zero current through itself, substantially independent of the voltage across it which results from the successive applications of the switch on and off states to the load network.

Hereafter, the term the switch is employed to denote the output port of an active device which acts substantially as a switch as described above. Both transistors and vacuum tubes can be used as such switches.

The increased efficiency achieved by using the active device as a two-state switch rather than as a high-impedance current source results from reducing the voltage which exists across the active device during the time that current is flowing through it (condition (*a*) of Section I above). As discussed above, a practical active-device current source requires at least a certain minimum permissible voltage across itself; an active-device switch, on the other hand, may be operated so as to reduce the voltage across it in the on state to a much smaller value.

Note the distinctions between the use of a current source to drive a load network and the use of a two-state switch to drive a differently-designed load network:

| Characteristic | Amplifier Using Current Source | Amplifier Using Two-State Switch |
|---|---|---|
| Active-device output port impedance | Always high | "on": low<br>"off": high |
| Is the active device allowed to saturate? | No. | Often intentionally, when "on". |
| Desired voltage across the active device while conducting current | Greater than a specified minimum value | As low as can be obtained |
| What determines the voltage across the active device while it is conducting current? | The voltage response of the load network input port impedance to the current pulses delivered by the current source. | The voltage approaches zero because of the low-impedance property of the "on" switch, independent of the properties of the load network. |

-continued

| Characteristic | Amplifier Using Current Source | Amplifier Using Two-State Switch |
|---|---|---|
| Does the voltage across the active device output port during current conduction depend on the load network input-port impedance? | Yes. | No. |
| What determines the current which flows through the active device when it is conducting current? | Only its input signal | The load network to which its output port is connected |
| To what criteria should the load network be designed? | The input-port voltage waveform produced in response to a specified repetitive current pulse train injected into its input port. | The input-port voltage waveform produced by repetitive alternately connected short circuits and open-circuits at its input port. (The full use of this criterion is novel in the present invention (see Sections IV and V below.) |

In an actual active device switch, the on impedance is not, of course, exactly zero, nor is the off impedance exactly infinity. The dc impedance (i.e. V/I) need not even be as low in the on state or as high in the off state as the active device characteristics may permit. For example, a transistor switch may be intentionally operated in the on state to be almost, but not quite, saturated, in order to avoid large storage time. Such operation entails a minor increase in on state power dissipation but may be advantageous for other reasons. In general, the switching-mode active device is defined, and thereby sharply distinguished from the current-source active device, by its output port ac impedances: in a switching-mode device, the on state ac impedance (i.e. $\delta V/\delta I$) is, exclusive of incidental reactances, low compared to the ac impedances in the surrounding circuit; in a currentsource device, the ac impedance is high compared to the surrounding circuit ac impedances, throughout the ac cycle.

B. Prior Art Circuits Using a Pair of Switches

Prior art "current-switching" and "voltage-switching" oscillators which use switches and either parallel-tuned or series-tuned resonant circuits, respectively, are described by P. J. Baxandall in "Transistor Sine-Wave LC Oscillators, Some General Considerations and New Developments", *IEE Proceedings*, Vol. 106, Part B, 1959, pp. 748–758. Both types of oscillators can be adapted for use as power amplifiers by feeding their inputs from signal sources instead of from their own outputs. Osborne (op. cit.); W. J. Chudobiak and D. F. Page, "Frequency and Power Limitations of Class D Transistor Amplifiers", *IEEE Journal of Solid-State Circuits*, Vol. SC-4, No. 1, pp. 25–37, February 1969; and D.F. Page, W. D. Hindson, and W. J. Chudobiak "On Solid-State Class-D Systems", *Proc. IEEE*, Vol. 53, NO. 4, pp. 423–424, April 1965 have described such amplifiers. Following Baxandall's notation, such amplifiers are often called "Class D", defined as circuits in which the active devices are operated as switches which are on for about half of the ac cycle, and off for the remainder of the cycle. The Class D circuits described by Baxandall and by Chudobiak et al use a pair of transistors as a double-pole single-throw switch; the transistor inputs are so driven that one switch pole is "open" while the other is "closed", and vice versa. These amplifiers are efficient, but suffer from the possibility of both switches conducting simultaneously or being off simultaneously during the switching transient, leading to loss of efficiency at high frequencies and to the possibility of transistor destruction by second breakdown (Chudobiak and Page, op. cit.). Chudobiak et al did not account for another limitation on efficiency at high frequency for the voltage-switching amplifier: the power dissipated in charging the $C_{ob}$ of both of the two switching transistors to the full supply voltage ($V_{CC}$), twice each ac cycle, at the operating frequency ($f$); this power dissipation is equal to $\frac{1}{2}(2f)(2C_{ob})V_{CC}^2$.

C. Prior Art Circuits Using a Single Switch

Timing problems of a pair of switches are avoided by using a single switch in an "single-ended" amplifier. D. R. Lohrmann, "Amplifier has 85% Efficiency While Providing Up to 10 Watts Power Over a Wide Frequency Band", *Electronic Design*, Vol. 14, No. 5, pp. 38–43, Mar. 1, 1966; *High-efficiency transistor cw rf power amplifier*, Res. & Dev. Tech. Rept. ECOM-2836, U.S. Army Electronics Command, Ft. Monmouth, N.J. May 1967; "Boost Class-D RF Amplifier Efficiency", *Electronic Design*, Vol. 16, No. 1, pp. 96–99, Jan. 4, 1968; and G. Oliva and D. R. Lohrmann, *High-Efficiency VHF Power Amplifier*, Res. & Dev. Tech. Rept. ECOM-3209, U.S. Army Electronics Command, Ft. Monmouth, N.J., December 1969 describe such circuits, using a transistor operated as a switch at about 50% duty ratio. Their amplifiers employ load networks similar to those used in current-source tuned power amplifiers. They do not consider the possiblity of increasing the transistor collector efficiency through unconventional design of the load network.

D. Prior Art "Current-Source" Circuits in Which the Current Source May Accidentally Be Allowed to Saturate A common prior art method of load network design for tuned power amplifiers is to determine the "best" load for an amplifier in terms of the paralleled resistance (R) and reactance (X) presented to the active device output port, e.g. from a transistor collector to ground. Only the impedence at the fundamental frequency are taken into account; neither $Z(f)$ nor switched transient response is considered; L and C are considered only in terms of presenting a desired R and X to the active device at the fundamental frequency. The X is chosen to resonate the effective output-port parallel reactance of the active device at the fundamental frequency. The R is chosen to bring the voltage across the active device almost to zero at the minimum of an assumed (but often incorrectly assumed) sinusoidal waveform. Examples of this approach are set out in publications by R. Hejhall, "Systemizing RF Power Amplifier Design," Application Note AN-282, Motorola Semiconductor Products, Inc.; D.L. Wollesen, "UHF Transmission-Line Power Amplifier Designed With Smith Chart Techniques", Application Note AN-217, Motorola Semiconductor Products, Inc.; F. Davis, "Matching Network Designs With Computer Solutions", Application Note AN- 267, Motorola Semiconductor Products, Inc.; C. Leuthauser and B. Maximow, "16-and 25-Watt Broadband Power Amplifiers Using RCA-2N5918, 2N5919, and TA7706 UHF/Microwave Power Transistors", Application Note AN-4421, RCA Solid State Division; R. Minton, "Semiconductor High-Frequency Power-Amplifier Design", Publication No. ST-3230, RCA Electronic Components and Devices; and T.M. Scott, "Tuned Power Amplifiers", *IEEE Trans. Circuit. Theory* Vol. CT-11, No. 3, pp. 385–389, September 1964. These examples ostensibly involve current-source tuned Class C and Class B amplifiers(a current-source tuned Class B amplifier is an extension of the previously discussed Class C to a conduction angle of about 180°, without the additional resonators of Tyler et al (op. cit.) and with the load network designed so as to keep the active device out of saturation). In actual fact, however, the active device often saturates during part of the time that it is passing current, contrary to the design assumption. If the active device so saturates (e.g. because R is too large, $V_{CC}$ is too small, or excessive imput-port drive is applied), the active device may then accidentally act approximately as an on switch during the time that is is saturated, but with the possibility of the potentially-destructive conditions discussed previously. Such an amplifier approaches the operation of an amplifier using a switch, as the active device input-port drive magnitude approaches infinity. (The switch duty ratio depends on the input-port dc bias and the waveshape of the input-port drive.) Such an amplifier comprises: 1) an active device which is an on switch for part of the on time, depending on the variables mentioned above, and a current source for the remainder of the ac cycle, together with (2) a load network designed on the assumption of a pure current-source active device. As will be shown below, the resulting amplifier is considerably inferior in performance to that of the switching-mode amplifier of the present invention.

IV. NEW APPROACH TAKEN FOR THE PRESENT INVENTION

A circuit which uses the active device as a switch is potentially highly efficient, since the on and off states of the active device switch closely fulfill conditions (*a*) and (*b*) respectively, of Section I above. In practical high-frequency switching-mode amplifiers, however, the switching time of the active device may be a considerable fraction of the ac cycle, and considerable power may be dissipated in the active device during switching, in violation of condition (*c*) of Section I above. It is clearly desirable to minimize the switching time, through choice of a suitably fast active device and through proper driver circuit design. Nevertheless, substantial switching times are often unavoidable. According to the principle of the present invention, the active device power loss during switching may be reduced by the use of certain circuit designs in the load network, taking particular account of the transient response thereof as the active device switch is cyclically operated. Prior art switchingmode amplifiers do not employ these load network designs; they generally employ circuit topologies and element values carried over from current-source practice, even though the principles of switching-mode amplifiers and current-source amplifiers are radically different. A load netowrk designed to have a sinusoidal (Class C) or flat-bottomed (modified Class C) voltage in response to a train of current pulses from a high-impedance current source will exhibit, in response to a cyclically-operated switch, voltage and current waveforms which are decidedly nonoptimum from the standpoint of efficiency.

The present invention resides in a new class of high-efficiency tuned single-ended switching amplifiers based on novel principles of operation. The load network is arranged to have a transient response disclosed hereinbelow. The invention is further illustrated by a detailed description of one embodiment thereof. A convenient embodiment of the invention has the same interconnection of components as one prior art network used with current-source active devices, but has specific different values of L, C, and $Q_L$ which are chosen to meet the specific mathematical conditions of the present invention. These conditions result from the requirements for high efficiency and for minimizing the detrimental effects of non-zero switching times. The component values are different from the ones employed in amplifiers designed according to prior art principles (such as those described above). Harmonic output for an amplifier using the load networks described herein is comparable with that of a conventional amplifier.

The principle object of the present invention is to provide tuned single-ended switching amplifiers capable of providing higher efficiency or greater power output or greater reliability in operation or any combination thereof than is attained in prior art tuned amplifiers employing comparable active devices.

Another object of the present invention is to provide load networks for tuned single-ended switching amplifiers which cause the amplifier to provide higher efficiency and/or more power output and/or greater reliability in operation than are attained in tuned single-ended switching amplifiers employing prior art load networks.

These and other objects and advantages of the invention will become apparent from the following detailed description and the accompanying drawings, in which.

For convenience of exposition, the remaining text is written in terms of an rf power amplifier in which the power output active device is a common-emitter npn transistor operated substantially as a two-state switch. The active-device output port is loaded by the input port of a "load network" which serves to generate desirable voltage and current waveforms at the output port of the active device. Ac power is delivered to a "load" (e.g. rf power is delivered to a radio transmitting antenna) connected to the output port of the load network. The load need not be the ultimate place in which the power is dissipated, but may be anything which accepts power delivered by the load network, for example, (1) the input port of a coupling or filter network whose output port is connected to a subsequent load (e.g. a low-pass or band-pass network which serves to attenuate the harmonic-frequency components of the signal passing from the load network input port to the subsequent load), or (2) the input port of another amplifier stage. The load network can also serve to transform the load impedance magnitude to a desired value and/or to accomodate load reactive impedance. The use of specific examples for exposition of the operation of the present invention should not be construed as a limitation on the scope of the invention; this specification and the appended claims are intended to apply to an amplifier using any type of active device operated substantially as a switch as defined previously, operating at any frequency greater than zero for which the load networks to be described below may be practically implemented, and feeding any type of load to which substantial energy must be delivered. In particular: transistors may be used as switches in the common-base and common-collector modes also; vacuum tubes may be used as switches in the common-cathode, common-grid or common-anode modes; and transmission-line equivalents of the lumped L-C networks employed in the exposition below may be used when practicable, such as a quarter wavelength transmission line substituted for L1 in the circuits of FIGS. 3, 7, and 8. For illustration, the load is represented hereafter as a resistance, or as a series combination of resistance and inductance and/or capacitance.

V. DESCRIPTION OF THE INVENTION

A. General Principles of the Present Invention

Figure 1:
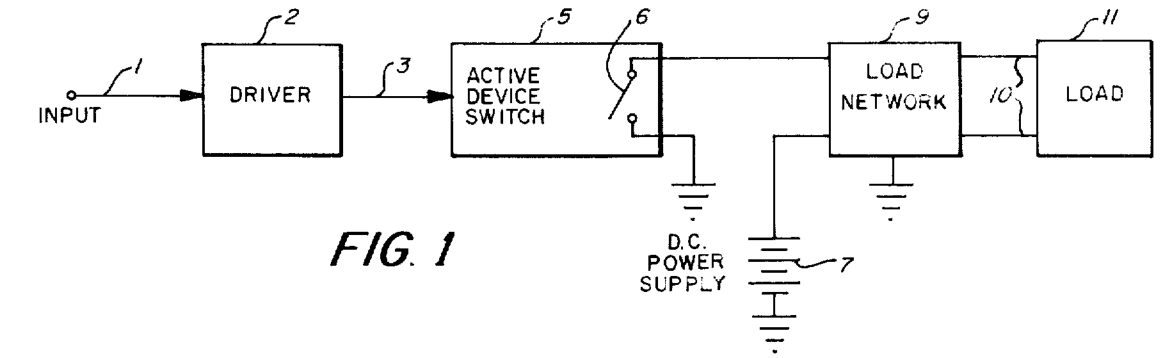
FIG. 1 is a simplified block diagram of a single-ended switching-mode amplifier.

The block diagram of FIG. 1 represents a single-ended switching-mode amplifier. The input signal is coupled over lead 1 to driver stage 2, the latter controlling active device 5 via a signal coupled over lead 3. Active device 5 acts substantially as a switch when appropriately driven by driver 2. The output port of active device 5 is therefore symbolically represented as a single-pole single-throw switch 6. The switching action of switch 6 may, of course, be nonideal, i.e. the on resistance (dc and/or ac) may be nonzero, the off resistance (dc and/or ac) may be noninfinite, and the turn-on and turn-off switching times may be nonzero. Connected across switch 6 is the series combination of a dc power supply 7 and the input port of a load network 9. The output port of load network 9 is connected to the load 11. As the switch 6 is cyclically operated at the desired ac output frequency, dc energy from power supply 7 is converted into ac energy at the switching frequency (and harmonics thereof). To obtain maximum fundamental-frequency output, the duty ratio of the switch 6 is made substantially 50% so that the switch is on for substantially half of the ac period and off for the remainder of the period. (For purposes of tuning or control of power output, the duty ratio may optionally be made other than 50%, as will be seen below.) The output ac power is coupled to the load 11 via load network 9. Often load network 9 employs a low-pass or band-pass filter to prevent harmonics of the switching frequency from reaching the load 11; in that event the voltage at lead pair 10 is substantially a pure sine wave at the fundamental frequency. The load network 9 may also contain means for transformation of the load impedance and/or for accommodating any reactance therein; these can be of conventional character and design. The load network 9 may contain both passive and active components, but dissipative elements (e.g. resistors) should be avoided to attain maximum power efficiency.

If the switching time of the switch 6 is nonzero, as is the case in all actual active-device switches, the efficiency of the switch can be enhanced by a novel design of the load network 9. Consider first, for purposes of comparison, a switching amplifier which drives a resistive load. Slow turn-on and turn-off times of the active device 5 greatly increase the power loss in that active device because the active device 5 encounters high transient power dissipation during the switching intervals, having imposed on it simultaneously a large fraction of the peak current and a large fraction of the peak voltage (e.g. at the 50% point, the device carries half the peak current and half the peak voltage). Clearly the switching time should be minimized as much as feasible, in accordance with condition (c) for high efficiency of Section I above. Nevertheless, substantial switching times are often unavoidable. In the prior art, the resulting degradation of efficiency was thought to be likewise unavoidable. The novel principle of the present invention is that proper design of a nonresistive load network can greatly reduce the amount of this transient power dissipation, avoiding by design the simultaneous imposition of substantial voltage and substantial current on the switch, even during the switching intervals.

Figures 2A, 2B:
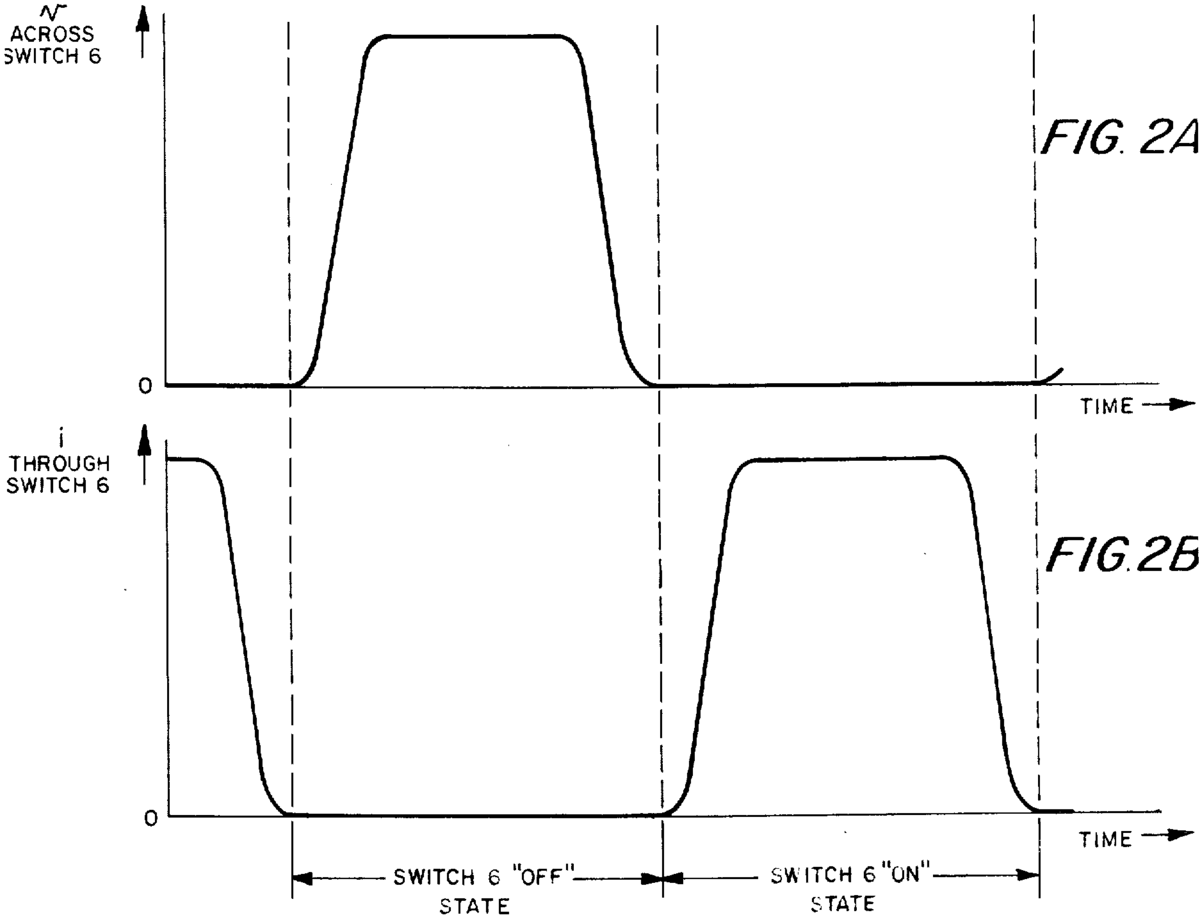
FIGS. 2A and 2B depict voltage and current waveforms, respectively, illustrating the principles of the present invention as applied to a FIG. 1 amplifier employing an active device with nonzero switching times.

FIGS. 2A and 2B show the waveforms of voltage across switch 6 and current flow through switch 6, respectively, in a circuit of the type of FIG. 1 arranged according to the principles of the present invention for high power efficiency. The following conditions are met by the waveforms illustrated in FIG. 2.

1. During the on state of switch, when there is appreciable current flowing through the switch, the voltage across the switch is as near zero as possible.

2. During the off state of the switch, when there is appreciable voltage across the switch, the current flowing through the switch is as near zero as possible.

These first two conditions are well known in the prior art, and require only that the active device 5 be chosen and the associated driver stage 2 be designed to cause the switch 6 on state saturation voltage and off state leakage current to be as near to zero as possible. These conditions are substantially independent of the design of the load network 9.

3. The switching time of switch 6 is as near zero as possible. This condition is also known in the prior art, and may also be fulfilled by proper choice of the active device 5 and proper design of the driver stage 2. This condition is mildly dependent on the design of the load network 9, although the prior art has not taken cognizance of this dependence on load network design. To the extent that the load network design does in fact affect the switching time, it will be seen below that the load network of the present invention causes the switching time to be decreased compared with prior art load networks.

Nevertheless, the switching time of the switch 6 is often substantial no matter what load network is employed. In the prior art, the load network 9 is usually one of several standard designs, in which the element values are calculated according to conditions of impedance matching relevant to current-source amplifiers but not to switching-mode amplifiers. See for example, Hejhall, op. cit., and Minton, op. cit. In the present invention, an unconventional design for the load network 9 is employed, with a view toward reducing the power dissipation in the active device 5 during the unavoidable switching intervals through manipulation of the load network 9 input-port transient response during those intervals. In particular, the load network 9 is arranged to have the following input-port transient response;

4. In the time interval during which the switch 6 is making its transition from the on to the off state, the voltage across the switch remains low until the current through the switch has been reduced substantially to zero. Then the voltage increases. This assures that high voltage does not exist across the switch until the current through it is reduced to zero, thereby avoiding the energy loss which would have existed if the voltage had been allowed to start to increase before the current decrease to zero had been substantially completed.

5. During the switch 6 off state, the load network 9 input-port transient response carrier the voltage across the switch first upwards, and then back downwards toward zero; this voltage reaches zero immediately prior to the start of the switch on state, i.e. just before current begins to flow in the switch. Thereby avoided is the energy dissipation which would have occurred if the switch current had begun flowing while the voltage across the switch was still high, and had thereafter discharged the capacitance at the load network input port down to ground. (This capacitance includes intrinsic switch 6 capacitance and circuit stray capacitance, as well as any capacitance purposely designed into the circuit.)

6. When the off state transient response reaches zero voltage across the switch 6, i.e. just at the end of the off state, it does so with approximately zero slope (i.e. $dv/dt \approx 0$). This permits accidental slight mistuning of the amplifier without severe loss of efficiency. Moreover, the conditions $v=0$ and $dv/dt=0$ at the end of the off state together imply that the switch 6 current at the start of the on state will be zero, and that during the on state current need increase from zero only gradually. In view of the limited $di/dt$ capabilities of actual active-device switches, this zero starting current is desirable in that it helps to minimize the turn-on time of the switch 6 in the active device and hence, further minimizes dissipation during the turn-on transient.

7. The voltage transient response waveform has a flat top.

8. The current transient response waveform has a flat top.

The advantage of conditions (7) and (8) may be seen as follows efficiency is defined as $\eta$=power output/power input = 1 − power loss/power input ; therefore, in order to maximize efficiency, the power input should be maximized as well as the power loss minimized. The power input is equal to the dc voltage of power supply 7 multiplied by the dc current drawn from power supply 7. Since no dissipative elements or batteries are present in load network 9 (and it is assumed that no dc current flows in the load 11), the dc component of current into the lower terminal of the input port of load network 9 equals the dc component of current out of the upper terminal thereof. The dc voltage of power supply 7 is thus equal to the time-average value of voltage across the switch 6, and the dc current drawn from power supply 7 is equal to the time-average value of current flowing through the switch 6. Since the power input is thus equal to the time-average value of the voltage v multiplied by the time-average value of the current i, these average values should be maximized consistent with the rating of the active device 5 and provided that the power loss is not thereby increased more than proportionately. Since power dissipation in the active device 5 is relatively low in this circuit, power input capability is likely to be limited by the peak voltage and peak current ratings of the active device 5. The above considerations dictate that the optimum voltage and current waveforms are flat-topped with short rise and fall times, the peak values being equal to the maxima which the active device 5 can withstand reliably. It must be noted, however, that the foregoing analysis assumes that neither the load network 9 nor any low-pass or band-pass filters occurring in the load 11 act to dissipate any harmonic frequency energy. If these circuits are in fact lossy at harmonic frequencies (e.g. filter elements have finite Q), the increase in efficiency due to the factors analyzed above may be offset by the decrease in efficiency due to increased harmonic energy dissipation, since the flat-topped wave has relatively high harmonic content. In such a case, voltage and current waveforms of lower harmonic content (such as those in FIG. 4, to be described below) may produce higher net efficiency than would the flat-topped waveforms.

It should be noted that the waveforms of FIG. 2, while superficially resembling the approximately square waves of a switching amplifier driving a resistive load, are in fact different in one absolutely crucial respect, viz. the rise of each waveform is delayed relative to the fall of the other so that the waveform does not rise from zero until the other waveform has decreased to substantially zero. This is accomplished by proper design of a nonresistive load network 9, and results in a considerable increase in efficiency if the transition time of the switch is an appreciable fraction of a half-cycle of the ac waveform.

It may also be noted that the conditions (4) through (8) specifying the input-port transient response of the load network 9 are entirely independent (except that condition (6) presupposes condition (5)), and any or all of them may be employed in the load network 9 for an amplifier embodying the present invention. In particular, the flat tops in the voltage and current waveforms are not necessary to the main principle of the present invention, viz. that of reducing power dissipation through the aforesaid delays of the waveforms. In practice, obtaining the flat-topped waveforms is often a secondary consideration, and has only a minor effect on efficiency compared with the effect of the aforesaid delays.

B. Description of Rudimentary Embodiment of the Invention

The above principles will now be illustrated with reference to the embodiment of the invention depicted in FIG. 3 and the modifications thereof depicted in FIGS. 5 through 8. These embodiments are illustrative only, and should not be construed as a limitation on the invention inasmuch as the invention can be embodied in other circuit arrangements having the requisite transient response properties. Particular alternative circuits based on the above principles will be the subject of a separate application for Letters Patent of the United States. Those circuits are specific embodiments of the principles of present invention, and are alternatives to or improvements upon the embodiment to be described hereinbelow.

Figure 3:
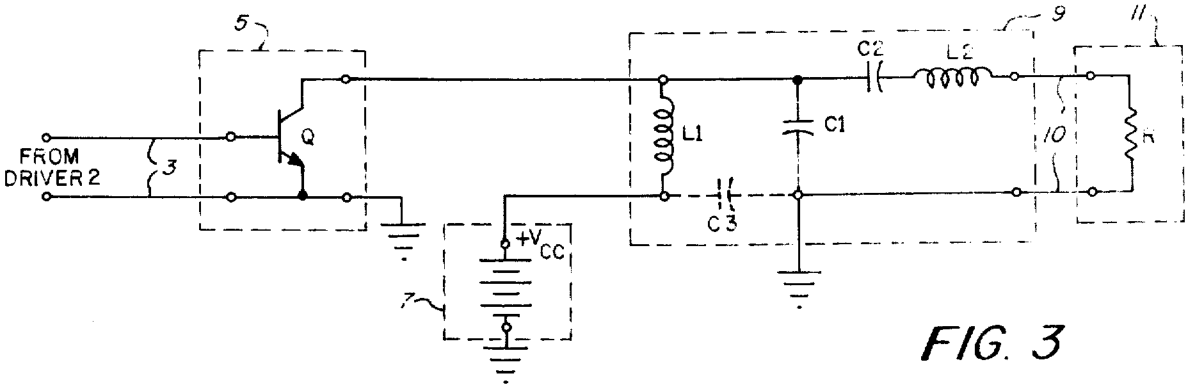
FIG. 3 is a circuit diagram of an embodiment of the invention.

In the circuit of FIG. 3, the active device 5 is represented, by way of example, by the npn transistor Q connected in the common-emitter mode; the dc power supply 7 is represented by $+V_{CC}$; the load network 9 consists of inductors L1 and L2 and capacitors C1 and C2, arranged as shown; and the load 11 is represented in simplified form by the resistor R. Reactance of the load 11 (if any) is accommodated by absorbing it into C2 and/or L2; load series inductance effectively increases L2, and load series capacitance effectively decreases C2. The serial order depicted in FIG. 3 of the elements C2, L2, and R is unimportant because those elements may be put in any serial order without altering the performance of the network in any significant respect. The power supply $+V_{CC}$ is assumed to be bypassed to ground; this is represented by the low-impedance bypass capacitor C3 in dashed lines, which may, if desired, be considered to be part of the power supply 7, although it is often physically located at the load network 9. Hence the upper terminal of power supply 7 and the lower terminal of active device switch 5 are equivalent so far as the ac signals are concerned. Inductor L1 serves as a high-reactance $V_{CC}$ shunt feed choke. Circuit wiring capacitance and the output capacitance $C_{ob}$ of the transistor Q are effectively absorbed into capacitor C1 (at high enough frequencies, all of the capacitance C1 may be supplied by $C_{ob}$, and the capacitor C1 then need not exist as a separate physical entity). To the extent that the susceptance of L1 is not negligibly small in the frequency range of interest, the capacitance of C1 may be increased to provide the operating characteristics which are described hereinbelow for the case of the L1 susceptance being negligibly small. In some cases, it may be desirable to choose a value for L1 which yields appreciable susceptance, thereby increasing the required capacitance of C1, as for example, if more than the value required for C1 with negligibly small L2 susceptance is already supplied by $C_{ob}$.

The circuit of FIG. 3 is similar in topology to the prior art switching-mode circuit of Lohrmann (Electronic Design, Mar. 1, 1966, pp. 38 ff.); however the circuit element values, mode of operation, and resulting performance are considerably different. In the prior art circuit, capacitor C2 is effectively infinite, serving only as a dc block, and the values of capacitor C1 and inductor L2 are determined by analytical procedures carried over from the design of circuits using current-source active devices, even though the active device is not a current source but is a switch. The resulting operation is different from that of the present invention. The voltage waveform in the prior art circuit resembles a half-wave rectified sine wave; the current is negative during a portion of the on half-cycle, thereby placing the transistor Q in the inverted mode, in which its inverted gain and inverted saturation voltage may be poor, and in which mode it may suffer damage or destruction, as discussed previously. In addition, the large negative slope of the voltage waveform just prior to turn-on of the transistor Q causes performance to be more adversely affected by mistuning of the load network 9 than in the circuit of the present invention.

In the circuit of the present invention, capacitor C2 is non-infinite, and plays an important role in determining the transient response of the load network 9. The resonant circuit formed by capacitors C1 and C2, inductor L2, and resistor R is set up in resonant frequency and Q to produce the voltage waveform shown by the full-line curve in FIG. 4A. The resonant circuit, and in particular the capacitor C1, insures that in the time interval during which transistor Q is being turned off, $V_{CE}$ remains relatively low until after the collector current $I_C$ has fallen to zero, approximating the delay depicted in FIG. 2 and discussed above. This avoids the energy loss which would occur if the $V_{CE}$ voltage were allowed to rise rapidly before the current dropped to zero, as, for example, would occur with purely resistive collector load impedance. By choosing the element values of the resonant circuit as indicated below, the transient response thereof during the off state causes $V_{CE}$ to fall to zero (actually to $V_{CE(sat)} \approx 0$) just as the transistor Q is to be again turned on, thereby avoiding the energy loss attendant with discharging capacitor C1 from a high positive voltage to ground. The choice of element values indicated below also gives zero slope to the $V_{CE}$ waveform as it reaches the zero value at the end of the off half-cycle. These two conditions together insure zero starting collector current when the transistor is turned on, in contrast to the negative collector current in the prior art circuit of Lohrmann or the sudden large positive current in the resistive case. This zero current is also desirable because the turn-on time of the transistor is generally lowest at a low collector current, thereby minimizing whatever switching dissipation may be unavoidable during the turn-on transient. In addition, the zero-slope condition causes this circuit to be more tolerant of minor errors in timing of the transistor turn-on transient (mis-tuning) than is Lohrmann's circuit, because $V_{CE}$ will still be close to zero when the mistuned turn-on does occur. Furthermore, moderately-slow turn-on of the transistor does not cause the transistor to experience high power dissipation during turn-on, as would, for example, be the case if the transistor were driving a resistive load; this is because $V_{CE}$ is not increasing rapidly at the time when the transistor is turning on.

Proceeding now to describe the operation of the circuit of FIG. 3 in more detail;

During the time the transistor is on, the collector voltage is near ground (at $V_{CE(sat)}$ if the transistor is saturated, or slightly higher if it is almost, but not quite, saturated). When the transistor is switched off, the transient response of the load network 9 is the response of a damped second-order system, the series connection of an inductance L2, a resistance R and a capacitance $(C1 \cdot C2/(C1+C2))$, starting with a set of given initial energies stored in capacitors C1 and C2 and inductor L2. Inductor L1 is sufficiently large so as to act as a source of substantially constant current. Some of the energy stored in C1, C2, and L2 is delivered to R (the network damping, but also the useful load) during the ringing transient. Three possible kinds of transient response voltage waveshapes are shown in FIG. 4A, showing three different values of damping corresponding to three different values of network loaded Q ($Q_L$).

If too much damping exists (i.e. $Q_L$ is too low) the voltage across capacitor C1 never returns to zero. Therefore, the transistor must discharge capacitor C1 from some positive voltage $V_X$ to a near-zero voltage $V_O$ when it is next turned on, requiring the transistor to dissipate an energy of $\frac{1}{2}C1(V_X-V_O)^2$ per cycle. (Here the on state of the transistor switch is approximated as a small resistance in series with a collector-emitter offset voltage $V_O$.) This energy dissipation wastes power, and should be avoided. In addition, the transistor is subjected to the simultaneous occurrence of substantial collector-emitter voltage ($V_X$) and substantial collector current (the on collector current which flows at $V_{CE}=V_X$ with the input drive provided by the driver 2). This transient condition tends to cause secondary breakdown, a destructive failure of the transistor. Published prior art circuits subjected the transistor to this power-dissipating and potentially-destructive condition (e.g. R. L. Bailey, "Large-Signal Nonlinear Analysis of a High-power High-Frequency Junction Transistor", *IEEE Trans. Electron Devices*, vol. ED-17, no. 2, pp. 108–119, February 1970; see $V_{CE}$ waveform of his FIG. 2). The circuit of the present invention specifically avoids this undesirable condition by proper design of the load network 9.

Figure 5A:
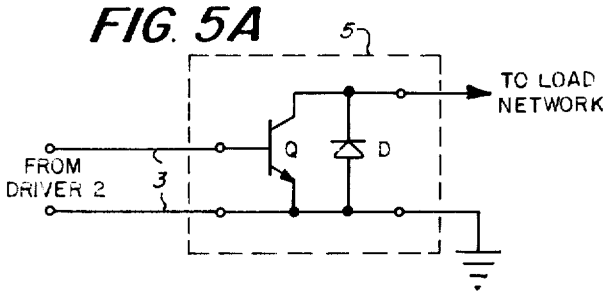
FIGS. 5A and 5B depict two methods of protecting the active device from the dangers of inverted operation.
Figure 5B:
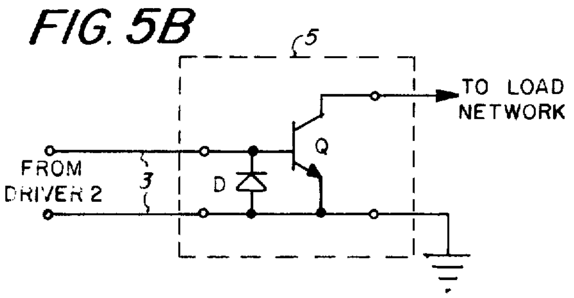

If too little damping exists (i.e. $Q_L$ is too high) the collector voltage $V_{CE}$ swings below zero, placing the transistor in the inverted mode. If this voltage is below the base off voltage provided by the driver 2, the transistor is placed in the active inverted mode with the base-collector junction forward-biased, and the base-emitter junction reverse-biased. The load will pull the base further negative by an amount which depends on the base signal source impedance and voltage, the load network transient response, and the transistor inverted-mode gain and cutoff frequency. Several outcomes are possible: (1) the $BV_{EBX}$ rating may be exceeded and the transistor may be damaged; (2)$BV_{ECX}$ (never specified) may be exceeded and the transistor may be damaged; (3) appreciable inverted collector current may flow, dissipating power (and hence losing efficiency) and possibly damaging the transistor; or (4) no damage will result. This underswing condition can occur also in similar prior art amplifiers; both in conventional amplifiers and in the amplifier of the present invention, damage can be prevented by adding a commutating diode D between the collector and emitter as shown in FIG. 5A, or between the base and emitter as shown in FIG. 5B, or by designing the base drive circuit properly.

Figures 4A, 4B:
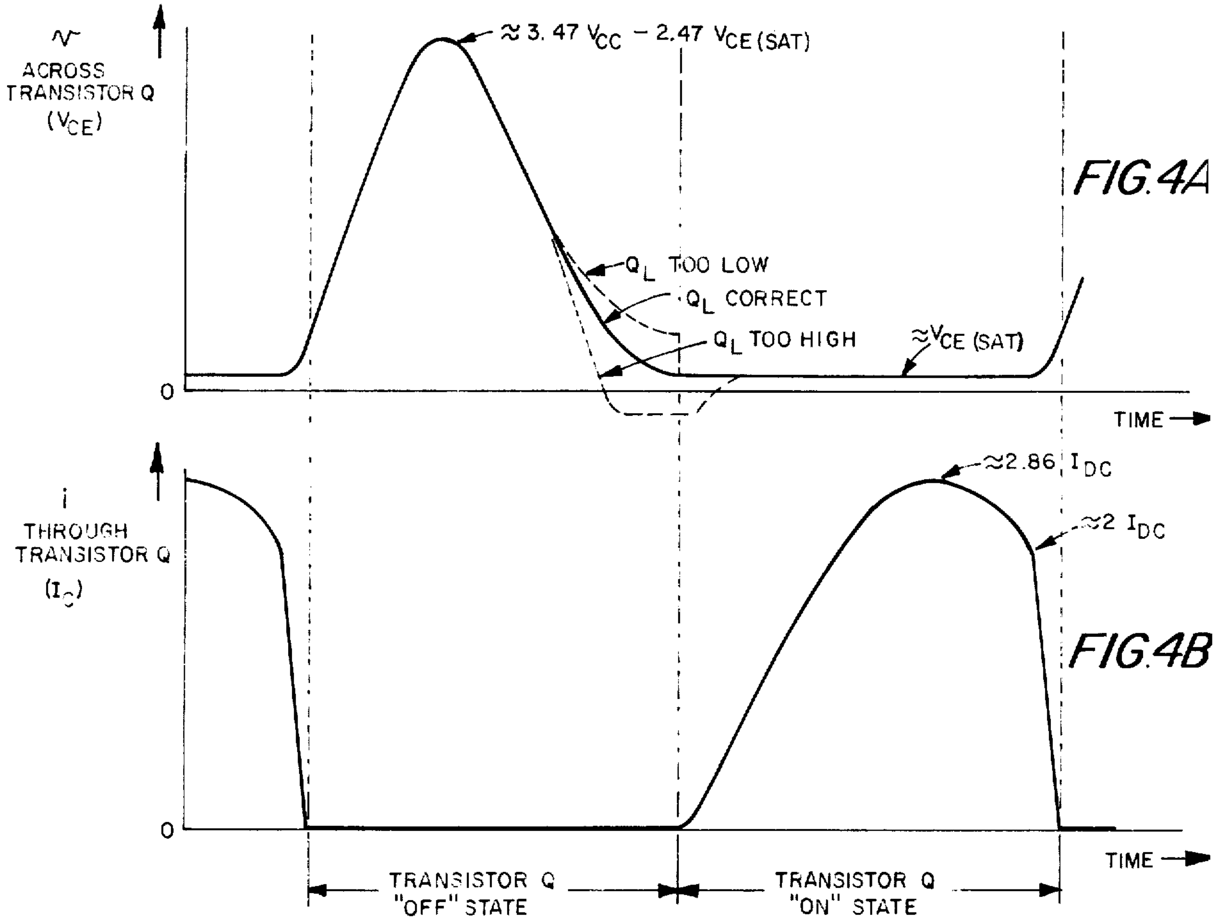
FIGS. 4A and 4B depict the voltage and current waveforms, respectively, in the FIG. 3 amplifier.

The circuit elements employed in the FIG. 3 embodiment of the present invention have values corresponding to the damping indicated in the full-line curve ($Q_L$ correct) of FIG. 4A. The peak negative-going voltage swing brings the collector voltage $V_{CE}$ just to zero (actually to $V_{CE(sat)}\approx 0$), avoiding the two undesirable conditions of too much and too little damping. If the tuning is correct, the transient response of the load network 9 brings the collector voltage $V_{CE}$ to zero at just the time when the transistor Q is to be turned on again. Thus at the time of transistor turn-on, when current $I_C$ is going to be required from the transistor Q, the voltage $V_{CE}$ is already at zero, providing low energy loss during the turn-on transient. Because the damping has the correct value, the waveform has zero slope when it reaches the zero axis, which is also desirable for reasons previously mentioned. If the transistor is not neutralized (see below), a small additional waveform component is fed into the load network input port via the parasitic capacitance $C_{ob}$ from the transistor base drive waveform. This component is a fraction $C_1/(C_1+C_{ob})$ of the base voltage waveform. A slight increase in $Q_L$ can compensate for the slight change in the load network input port voltage waveshape caused by this fed-through waveform component.

If a range of mis-tuning conditions must be accommodated (for example, in order to use fixed tuning over a large operating frequency range), it is less inefficient for $Q_L$ to be higher than optimum than for $Q_L$ to be substantially lower than optimum. This is because the reverse-polarity current in the switch, resulting from the mistuned $Q_L$ being higher than optimum, flows through only a small voltage drop, the transistor Q collector-to-emitter reverse voltage (in FIG. 3), or more desirably, the commutating diode D forward conduction voltage (in FIG. 5A) or the sum of the forward conduction voltages of the diode D and the base-collector junction of transistor Q (in FIG. 5B). A larger amount of power is generally dissipated when $Q_L$ is lower than optimum, the energy dissipation per cycle being equal to $\frac{1}{2}C1(V_X-V_O)^2$ as shown above. Therefore, the range of non-optimum $Q_L$, if any is necessary, should be from substantially too high, through optimum, to slightly too low. For the case of the transistor being on for 50% of the cycle, the limitation on the too low value is the value at which $V_{CE}$ at turn-on time has become substantially larger than $V_{CE(sat)}$. In the case of too high $Q_L$, placing the commutating diode D cathode at the transistor base, as in FIG. 5B, results in about twice as much energy loss than is the case if the diode cathode is at the collector, as in FIG. 5A. This is because the reverse-polarity switch current flows in the former case through two junctions in series (the commutating diode D and the base-collector junction of the transisitor Q) rather than through only the diode D. A useful result of adding the diode D at the base rather than at the collector is that the resulting current flow in the base-collector junction injects charge into the base region, preparing the transistor Q to conduct collector current in the normal direction when the subsequent on state beings. Depending on the design requirements and constraints of a particular application (including the turn-on drive available from the driver 2), it may be advantageous to design the load network 9 intentionally to have $Q_L$ slightly higher than the value which gives the zero-value zero-slope collector voltage at turn-on time, in order to allow the load current to aid in the turning-on of the transistor.

A substantially sinusoidal fundamental-frequency current flows in the inductor L2, capacitor C2, and load resistor R; the percentage harmonic distortion in this current is approximately inversely proportional to the network loaded Q ($Q_L$) and is small for typical values of $Q_L$ (e.g. greater than 5). In addition, a substantially constant current $I_{DC}$ is supplied by the high-reactance rf choke L1 which is connected to the dc power supply $+V_{CC}$. When the transistor is off, these combined currents flow into the capacitor C1, producing the off state $V_{CE}$ transient response described above. When the transistor is on, these currents flow in the transistor. The resulting on state collector current $I_C$ is approximately a section (between approximately −33° and +147° in angle) of a sine wave centered at $I_{DC}$. The beginning of this section corresponds to zero collector current; the peak collector current is approximately 2.86 $I_{DC}$; the turn-off transient begins when the collector current has decreased from the peak value to approximately 2 $I_{DC}$. This waveform is depicted in FIG. 4B.

During the portion of the ac cycle when the transistor is on and conducting appreciable current, the voltage across the transistor is low (approximately $V_{CE(sat)}$) and the dissipation is again minimal. Depending on the transistor storage time characteristics and the techniques used to accommodate them, the transistor is operated either in saturation or in the active region just outside of saturation.

The FIG. 3 embodiment also has the advantage of minimizing the possibility of both primary and secondary breakdown of the transistor, helping to insure reliability. Note that the simultaneous combination of substantial voltage and substantial current, which is a cause of secondary breakdown, is specifically avoided. High $V_{CE}$ does not occur until after $I_C$ has been cut off at a low voltage. When $V_{CE}$ becomes high, the base is already reverse-biased. Thus the $BV_{CEV}$ rating applies to the off condition, rather than the lower $BV_{CEO}$ or $BV_{CER}$ ratings.

In accordance with the description of operation given above, the element values in the FIG. 3 embodiment are obtained by choosing the three variables C1, C2, and L2 so as to meet simultaneously the following three mathematical conditions:

1. $V_{CE}=0$ at $t=(1-DR)\ (1/f)$ after switch turnoff time, where DR is the switch duty ratio, herein taken as substantially 50%, unless specified otherwise, and $f$ is the operating frequency.
2. $dV_{CE}/dt=0$ at $t=(1-DR)\ (1/f)$ after switch turnoff time.
3. The network loaded Q ($Q_L$) is any chosen value, which may be chosen as a desired compromise between efficiency and output harmonic content, as discussed below.

The values of R (effective load resistance presented to the output port of load network 9) and $V_{CC}$ are dictated by the requirement to deliver a specified power output to the load from the $V_{CC}$ power supply; specifying either one dictates the other. Maximum fundamental-frequency power output is obtained when the switch duty ratio is set at approximately 50%. A duty ratio other than this duty ratio can be used for purposes of modifying the power output and/or for control of the network tuning (to be discussed subsequently).

The ratio chosen for C1/C2 determines the value of loaded $Q(Q_L)$ for the L2-R combination which will yield the $V_{CE}$ condition of zero slope and zero value at turn-on time. The relationship is $Q_L \approx 6.3$ C1/C2. The design choice of $Q_L$ is determined by the relative importance of low harmonic frequency content of the power delivered to R (high $Q_L$) and high efficiency (low $Q_L$, making losses in L2, C1, and C2 relatively less important when compared with the power delivered to R). The fraction of ac power from the transistor Q which is lost as power dissipation in the reactive components is $Q_L/Q_U$, where $Q_U$ is the unloaded network Q. For example, if $Q_U=150$ and $Q_L=6$, 4% of the ac input power is lost in the reactive elements. The importance to efficiency of using low $Q_L$ is clear. A low $Q_L$ causes the output current to have a larger harmonic content, requiring better performance from any low-pass or band-pass filter which may be included in the load 11. When the better filter performance requires adding another filter section, additional ac loss is added there. Having been informed of the potential causes of power dissipation, the engineer skilled in the art can effect a design compromise to minimize the total loss in the load network 9 and in the subsequent filter (if any) while meeting the harmonic attenuation requirement. Typical $Q_L$ values range from 5 to 30.

Now that the operation of the FIG. 3 embodiment of the present invention has been explained, equations will be given which give the circuit element values and the resulting performance. Because the derivations of the equations are lengthy, they are not here presented. The validity of the equations, however, has been experimentally confirmed by the inventors. The equations are given for the case of a 50% duty ratio; modified equations hold for other values of duty ratio.

C. Performance Equations

The dc collector current ($I_{DC}$) of the transistor Q, while delivering ac power P, is (1)
$$I_{DC} \cong \frac{P}{V_{CC}}\left[1+\left(\frac{1+(1+1.26/Q_L)t_f f}{\frac{V_{CC}}{V_{CE(sat)}}-1}\right)+\left(\frac{((1+1.26/Q_L)t_f\,2\pi f)^2}{3\left(\frac{\pi^2}{4}+1\right)\left(1+\frac{1}{Q_L}\right)}\right)\right]$$

where $f$ is the operating frequency and $t_f$ is the collector current fall time (100% to 0% of a linear ramp) during transistor turnoff. The collector current waveshape is determined by the load network and is approximately a section of a sine wave centered at $I=I_{DC}$. Current builds up gradually from zero at the beginning of the on half-cycle, to a peak value of (2)
$$I_{Cpk} \cong I_{DC}\left(1+\sqrt{\frac{\pi^2}{4}+1}\right)(1+1.26/Q_L)=2.86 I_{DC}\ (1+1.26/Q_L).$$

It then decays gradually to 2 $I_{DC}(1+1.26/Q_L)$, at which time the transistor Q is suddenly turned off by the drive signal 3 applied to its base-emitter junction.

The peak collector-emitter voltage ($V_{CEpk}$) is (3) $V_{CEpk} \approx V_{CC}+2.47(V_{CC}-V_{CE(sat)})=3.47\ V_{CC}-2.47\ V_{CE(sat)}$.

These peak and dc values must be within the safe operating region of the transistor Q. The most stressful condition is turnoff of $\approx$ 2$I_{DC}$ linearly with time while $V_{CE}$ is rising parabolically.

The collector efficiency is $$(4)\quad \eta_t \cong 1-\left[\frac{V_{CE(sat)}}{V_{CC}}\left(1+(1+1.26/Q_L)t_f f\right)+\frac{((1+1.26/Q_L)t_f 2\pi f)^2\left(1-\frac{V_{CE(sat)}}{V_{CC}}\right)}{3\left(\frac{\pi^2}{4}+1\right)\left(1+\frac{1}{Q_L}\right)}\right]$$

D. Element Values

The value of R required to be presented to the output port of the load network 9 is determined by the power which must be delivered to the load and by the available collector dc power supply voltage, $V_{CC}$. (For highest efficiency the highest possible $V_{CC}$ should be used, within the voltage limitation of the transistor Q, as was shown above.) The value of R is found as $$(5)\quad R \cong \frac{(V_{CC}-V_{CE(sat)})^2}{P}\left(\frac{2}{\frac{\pi^2}{4}+1}\right)$$

If the ultimate load resistance is not equal to R, the load 11 must include an appropriate impedance transformation means, or the load network 9 must be modified from the version shown in FIG. 3 so as to include such impedance transformation means (see Section V.E. below).

Note that here P refers to the total power delivered by the transistor Q to the input port of load network 9. It is the sum of the power transmitted to load 11 and the ac osses in L1, L2, C1, and C2. Dc losses in L1 are accounted for by using an effective value of $V_{CC}$ which is lower than the dc power supply voltage by the value of the dc voltage drop in the dc resistance of L1. R is the total effective resistance load seen by the transistor Q. It is the sum of the input resistance of the load 11 and the series ac resistances of L2 and C2, plus an equivalent lumping of the ac losses of L1 and C1.

The desired $Q_L$ may be chosen freely, according to the design compromise to be made between efficiency and harmonic content of the power delivered to load 11, as described in Section V.B. above. Then $$(6)\quad L2 = \frac{1}{f}\left(\frac{Q_L R}{2\pi}\right)$$

$$(7)\quad C2 \cong \frac{\left(1+\frac{1}{Q_L}\right)}{(2\pi f)^2 L2} \cong \frac{1}{f}\left(\frac{1+\frac{1}{Q_L}}{2\pi Q_L R}\right)$$

$$(8)\quad C1 \cong C2\left(\frac{Q_L}{6.3}\right)-C_{ob} \cong \frac{1}{f}\left(\frac{1+\frac{1}{Q_L}}{2\pi 6.3 R}\right)-C_{ob}$$

As was stated in Section V.B., reactance of the load 11 (if any) is accommodated by absorbing it into the series combination of C2 and L2; hence the physical inductor L2 should be decreased if the series reactance of the load 11 is inductive, C2 increased if it is capacitive, or both done if it is a combination of both inductance and capacitance (e.g. a radio transmitter antenna). The impedance of an actual load 11 may, in fact, be more complicated than that represented by the series combination of a frequency-independent R and a frequency-independent L and/or C. Hence the effect of the load reactance may not be precisely the same as an effective increase in L2 and/or decrease in C2. However, for reasonably well-behaved load impedances, the net effect is only a small change in the L and C values needed for correct tuning, and a slight change in the voltage and current waveshapes from those which would have existed if the output branch had consisted solely of frequency-independent elements C2, L2 and R.

Now that the design procedure and design equations have been given for the embodiment of the present invention in the form of the circuit of FIG. 3, the substantial difference in design between a circuit of the present invention and a conventional tuned power amplifier can be shown. As a specific example of this difference, the table below shows the circuit element values for amplifiers with the circuit topology of FIG. 3 as realized with the conventional circuit approach (e.g. Hejhall, op. cit.) and with the design of the present invention. The element values are seen to be greatly different. This example is worked for an amplifier to deliver 20 watts at 10 MHz to a resistive load, using a $Q_L$ of 6, a power-supply voltage of 28 Vdc, an rf choke for L1, and a transistor with $V_{CE(sat)}$=3 V and $C_{out}$=30pF.

| Circuit Element | Conventional Design (Hejhall, op.cit.) | Present Invention |
|---|---|---|
| L2 | 0.056 μH | 1.72 μH |
| C1 | 4850 pF | 131 pF |
| C2 | ∞ | 169 pF |
| R | 0.53 ohms | 18 ohms |

E. Impedance Transformation and Capacitance Neutralization

Impedance transformation between the load 11 and the active device 5 can be provided by modifications of the circuit arrangement which is shown in FIG. 3 and discussed in Sections V.B. through V.D. above.

Figure 6:
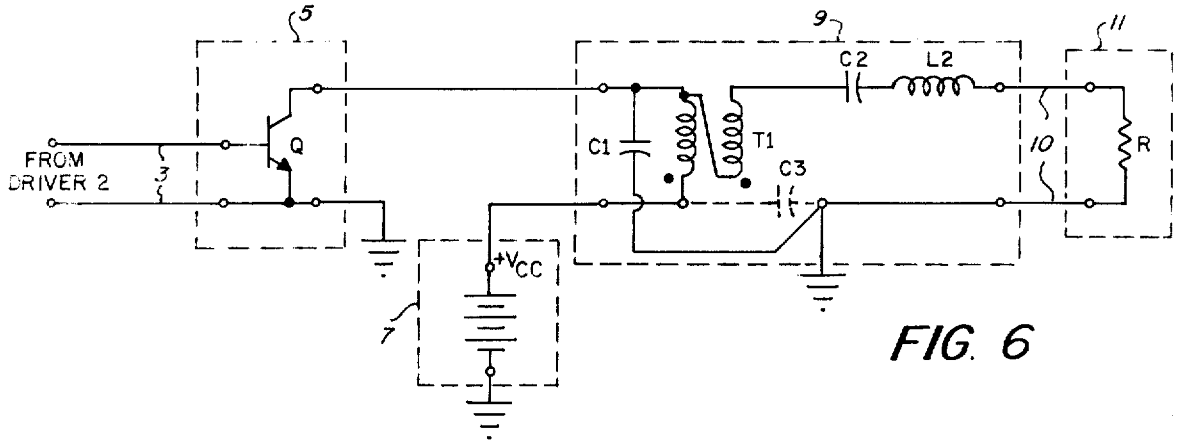
FIG. 6 depicts a modification of the circuit of FIG. 3, in which a transformer provides load impedance transformation.

By adding one or more additional windings, L1 can be changed from an inductor to a transformer T1 which acts to transform the load impedance to the desired transistor Q collector load impedance given by equation (5) above. This modification of the FIG. 3 circuit is shown in FIG. 6. Leakage inductance between the windings of transformer T1 can be absorbed into inductor L2. This can improve the efficiency by eliminating the ac losses which would have been present in that portion of L2 which is now replaced by the leakage inductance. Some or all of L2 can be removed this way.

If neutralization of the transistor collector-base capacitance ($C_{ob}$) is desired (e.g. to reduce the current through which must be supplied $C_{ob}$ by the driver stage 2) such neutralization can be supplied by use of an inverting winding on transformer T1, capacitively coupled to the base of the transistor, as is well known in the prior art.

The transformer T1 may conveniently be wound with polyfilar or separate windings, or both. If T1 is polyfilar, the ac output of transformer T1, applied to the C2-L2-R branch as in FIG. 6, can, in general, be $(1+n_1/n_2)$ times the ac input at the input port of the load network 9, where $n_1$ and $n_2$ are integers, and their values depend on how multiple primary and/or secondary windings are connected. $n_1$ is the number of secondary windings in series, and $n_2$ is the number of primary windings in series. (FIG. 6 depicts the case of $n_1 = n_2 1$.) If it is desired that $n_1/n_2$ be effectively the ratio of non-integer numbers, a separate inductor may be inserted between $+V_{CC}$ and the dotted end of the T1 primary winding. Then the ac voltage across the input port of load network 9 will divide between this separate inductor and the primary winding of T1, and the boost voltage added to the input-port voltage of load network 9 by each of the secondary windings of T1 can be a non-integer fraction of the input-port voltage, depending on the choice of the inductor value and the magnetizing inductance of T1. Note that connecting C1 on the primary side of T1 (i.e. directly across the output of active device 5/switch 6) rather than on the secondary side of T1 (i.e. from the left end of C2 to ground) allows C1 to serve better the function of delaying the rise of the voltage waveform at the turnoff time of active device 5/switch 6. This is because connection at the secondary side of T1 would insert the leakage inductance of transformer T1 between active device 5/switch 6 and capacitor C1, and an immediate voltage response could be developed across this leakage inductance, said response then appearing as voltage across active device 5/switch 6 during the turn-off transient. This tends to degrade the effectiveness of the delay function intended to be performed by C1.

Figure 7A:
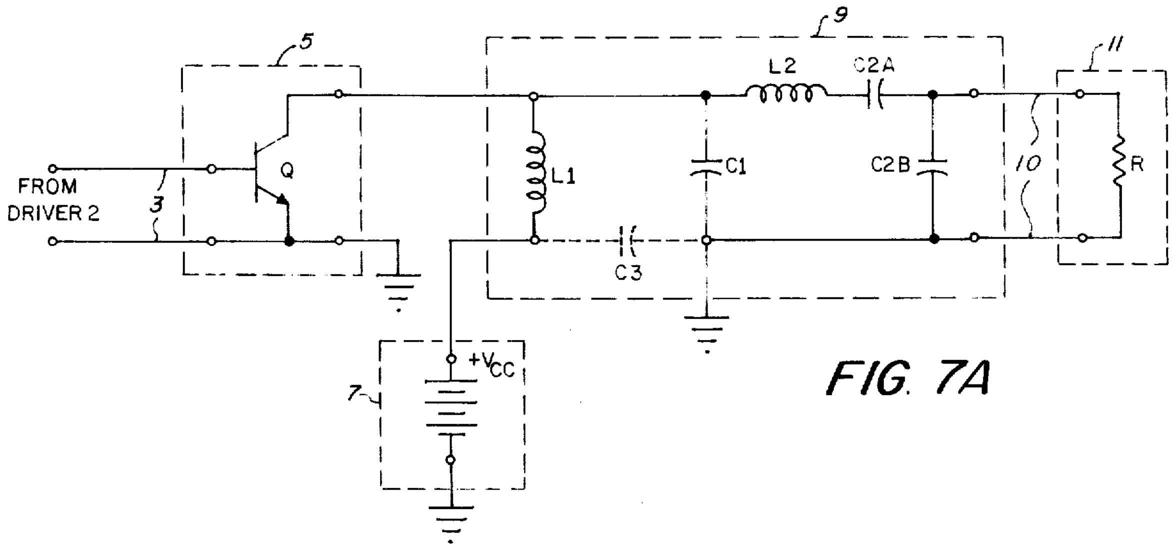
FIG. 7A through 7C depict alternative modifications of the circuit of FIG. 3, in which tapped capacitors provide load impedance transformation.
Figure 7B:
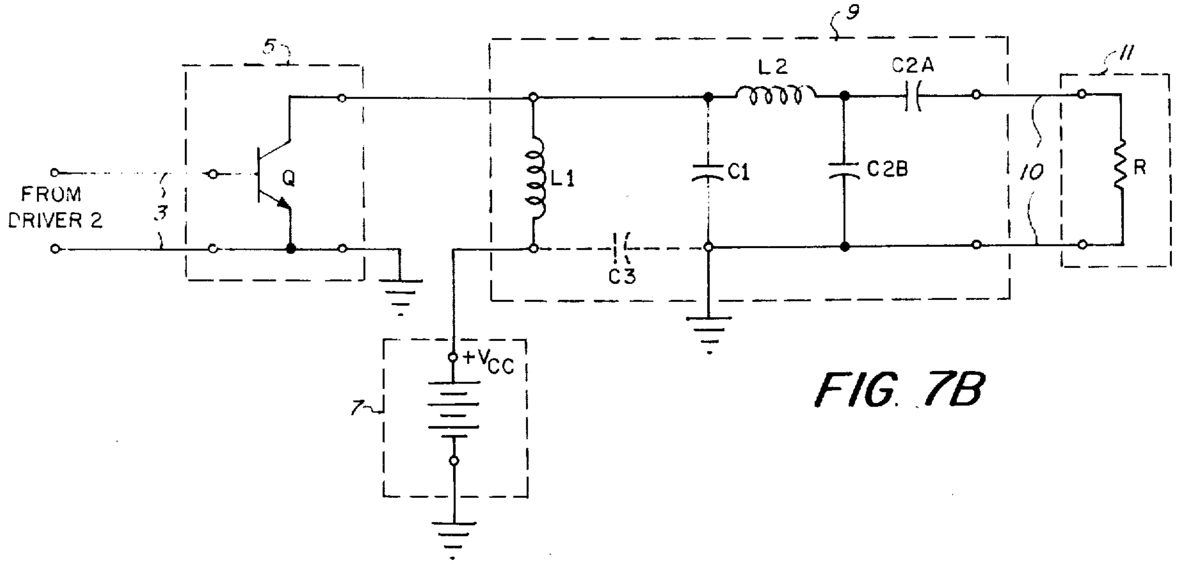
Figure 7C:
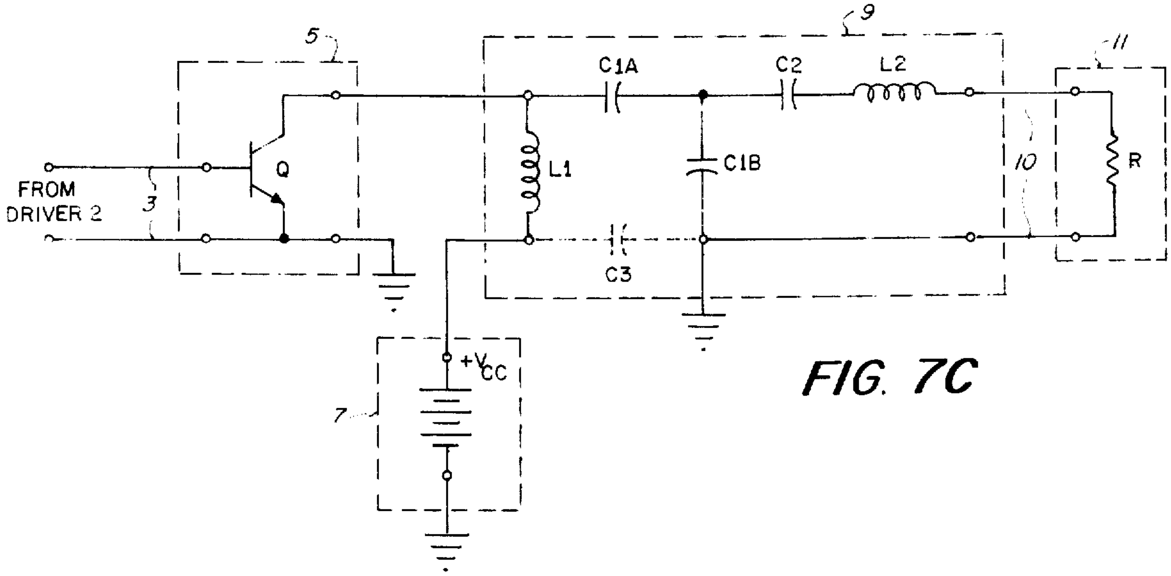

FIGS. 7A through 7C illustrated other variants of the FIG. 3 circuit will provide impedance transformation by effectively tapping capacitor C1 or capacitor C2. Capacitor C2 tapping into C2A and C2B is shown in FIGS. 7A and 7B, and capacitor C1 tapping into C1A and C1B is shown in FIG. 7C. The FIG. 7A combination of C2A in series with the parallel combination of R and C2B, and the FIG. 7B combination of C2B in parallel with the series combination of R and C2A, are each approximately equivalent to a resistor of new value R′ in series with a capacitor of new value C2′, according to well-known prior art of impedance transformation. These values R′ and C2′ are the effective series resistance and capacitance, respectively, seen by inductor L2, and are therefore the values determined by equations (5) and (7), respectively, of Section V.D. above. The actual values C2A and C2B are approximately those which, when combined with the load 11 of the specific application at hand, having resistance R, yield the above-determined values of R′ and C2′. If the load 11 contains reactance, it may be taken into account in performing the impedance transformation, according to well-known theory; the values of C2A and C2B will be modified thereby. In FIGS. 7A and 7B embodiments, it is permissible for the capacitor C2A to be effectively infinite (i.e. a dc block), or to be completely replaced by a direct connection (if application of a dc voltage $+V_{CC}$ to the upper terminal of load 11 does not result in unacceptable operating characteristics, e.g. if load 11 itself includes a dc block); even though the capacitor C2A is infinite or nonexistent, the effective capacitance C2′ is still non-infinite, and the novel transient response characteristics of the present invention may still be obtained.

In a manner similar to that preceding, the FIG. 7C arrangement can also be shown to be approximately equivalent to the embodiment of FIG. 3 was transformed values of the circuit component values to be used in place of C1, C2, L2, and R of the FIG. 3 embodiment. In the FIG. 7C embodiment, it is likewise permissible for the capacitor C2 to be effectively infinite or to be replaced by a direct connection, for the same reasons as above.

In all these cases of FIGS. 7A, 7B, and 7C arrangements and the above-mentioned modifications thereof, the circuit element values are arranged to provide a transient response to the load network 9 conforming to the principles of the invention as enunciated in Section V.A. above. It is clear that this is possible, inasmuch as these arrangements are similar to the FIG. 3 embodiment in that they: 1) provide a shunt capacitive path at the input port of load network 9, hence providing the function of input port voltage delay at the turn-off time of active device 5/switch 6, 2) provide effectively a non-infinite capacitance in series with inductor L2 (or the transformed equivalent of L2 in the FIG. 7C arrangement), hence providing a transient ringing voltage and current response of load network 9 both when switch 6 is on and when switch 6 is off, and 3) provide a damping on said transient response, hence the possibility of arranging that substantially zero voltage and current be imposed on switch 6 at the time switch 6 is to be turned on. The detailed transient responses of the FIGS. 7A, 7B and 7C embodiments of the invention are not exactly identical to that of the FIG. 3 embodiment, since the effective impedance transformations described above (which transform the former circuits into the latter), carried out at the operating frequency $f$, are in fact frequency-dependent. However, it will be appreciated that the details of the transient response need not be identical to that of the FIG. 3 embodiment, or of any other particular embodiment, in order that an embodiment of the present invention be thereby constituted. It is necessary only that the transient response conform to the principles of the invention as enunciated in Section V.A. above. In actual fact, however, the voltage and current waveforms for the FIGS. 7A, 7B, and 7C embodiments are very similar to those shown in FIG. 4 for the FIG. 3 embodiment.

These (and other) substantially equivalent variants of the load network 9 of FIG. 3 can be realized according to the criteria illustrated in detail herein for the form of the network shown in FIG. 3. Such variants can readily be conceived by those normally skilled in the art, now that the invention and its operating and design principles have been disclosed. It was shown above that although the circuit topology of FIG. 3 is the same as that of differently-operating prior art circuits, the circuit operating principles and design criteria and the resulting circuit element values, are, in fact, greatly different. That great difference can also be shown to exist for variants of the FIG. 3 embodiment of the present invention, when comparing them with prior art circuits of the same topology.

F. Tuning

If the amplifier is desired to operate at more than one frequency, provision may be made for varying C1, C2, and/or L2. Standard and well-Known bandswitching arrangements may be used to tune over several frequency bands, if needed. If tuning within a single band is not desired, the C1, C2 and L2 values may be fixed at a set of mid-band compromise values, with more performance variation (i.e. performance degradation) across the band than would be the case if they were adjustable. If tuning is desired in order to minimize the variation of performance across the band, C1 and/or C2 and/or L2 can be made variable.

For high efficiency L2 should have high ac unloaded $Q(Q_L)$ as was shown above. Therefore, a fixed inductor is usually preferred to a variable one because higher $Q_L$ is usually available from fixed inductors.

1. L2 Fixed, C1 and C2 Tune

If a fixed inductor L2 is employed, it may be set at a midband compromise value, with C1 and/or C2 being adjustable for tuning purposes. If the frequency band is relatively narrow, the performance degradation across the band is small. In this tuning arrangement, the required variations of C1 and C2 with frequency are $$C2 \cong \frac{1}{f^2}\left(1 + \left(\frac{f_M}{f}\right)/Q_M\right)\left(\frac{f_M}{2\pi R\ Q_M}\right) \cong \frac{K2}{f^2} \qquad (9)$$

$$C1 \cong C2\left(\frac{f}{f_M}\right)\left(\frac{Q_M}{6.3}\right) \cong \frac{1}{f}\left(1 + \left(\frac{f_M}{f}\right)Q_M\right)\left(\frac{1}{2\pi^2\ R\ 6.3}\right) \cong \frac{K1}{f} \qquad (10)$$

where $Q_M$ is the circuit $Q_L$ at a midband frequency $f_M$. These desired variations with frequency can be closely approximated if C1 and C2 are ganged and are proportioned correctly. Methods for so doing are well known in the prior art.

2. Single Variable Element

Figure 8A:
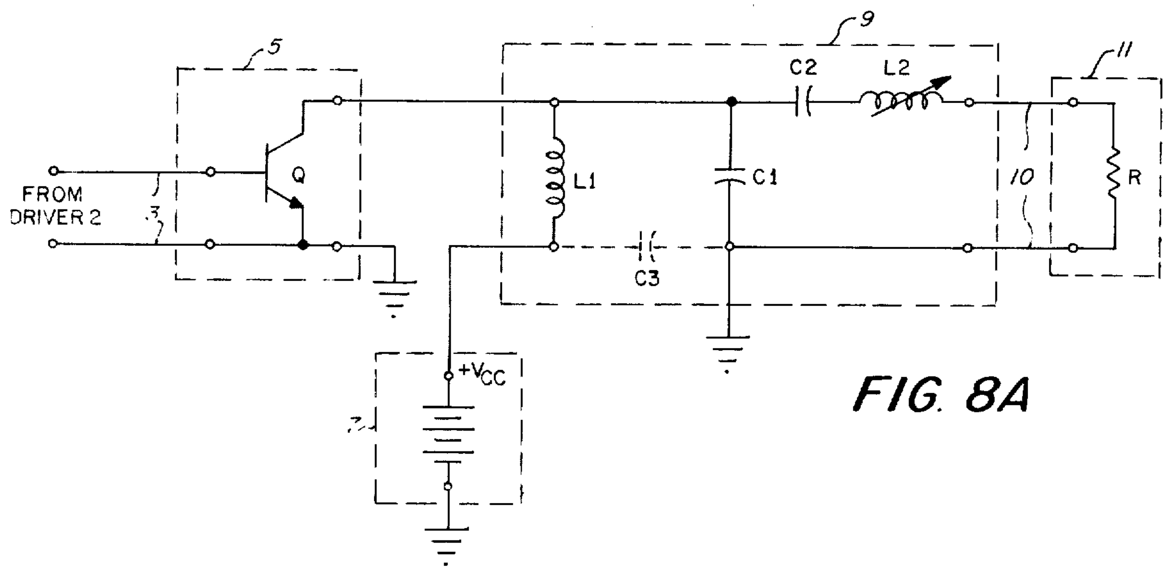
FIGS. 8A and 8B depict other modifications of the circuit of FIG. 3 to provide frequency tuning adjustment of the circuit.

Another method of tuning across a frequency band is shown in FIG. 8A, in which only a single component, L2, need be adjusted. It is assumed for the present that, over the frequency band, the load 11 remains a constant resistance in series with a constant inductance and/or capacitance. Because C1 and C2 are fixed, the $Q_L$ required for optimum performance is also fixed, being substantially 6.3 C1/C2, from equation (8) above. Then L2 must be adjusted to be proportional to $1/f$, where f is the frequency, in order to maintain $Q_L$ fixed for a given constant R, from equation (6). But, to maintain C2 constant, L2 must vary as $(1/f)^2$, as seen from equation (7). Thus, a compromise adjustment of L2 versus frequency must be used, to compromise between the requirements for $1/f$ and $(1/f)^2$. In practice, a satisfactory compromise can usually be made if the frequency range is of the order of 1½:1 or less.

Figure 8B:
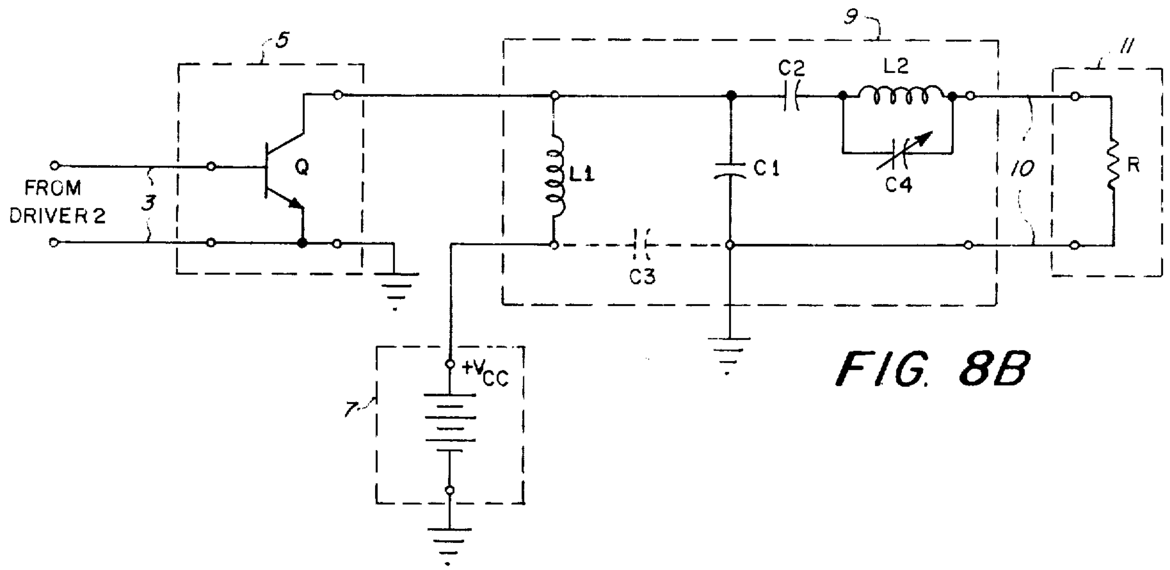

A related method of tuning across a frequency band is shown in FIG. 8B. This method also uses a single variable tuning component, in this case a capacitor C4, connected in parallel with L2. The capacitor C4 acts to partially cancel the effective susceptance of inductor L2. The net effect of increasing C4 is to increase the effective circuit inductance, and of decreasing C4 is to decrease the effective circuit inductance. Variation of capacitor C4 is therefore similar in effect to the variation of inductor L2 shown in FIG. 8A, but is often more convenient. With this technique, substantially ideal tuning and loading conditions can be obtained over a frequency range of 1.6:1 with all other circuit components having fixed values. For example, substantially correct tuning and loading were obtained experimentally by the inventors with C1=704pF, C2=698 pF, L2=27.1 uH, R=30.1 ohms, $C_{ob}$ of transistor Q≈10pF, and C4 vs. frequency as follows:

| Frequency (MHz) | C4 (pF) |
|---|---|
| 1.33 | 0 |
| 1.22 | 98.5 |
| 0.78 | 1075 |

At lower frequencies and larger values of C4, the $Q_L$ became too low, so that R would have needed to be decreased and/or L2 increased.

3. Tuning by Varying Switch Duty Ratio

When the circuit components are set for a particular frequency and switch duty ratio, the switch voltage (i.e. transistor Q collector-to-emitter voltage) is substantially zero at switch turn-on time. If the frequency is decreased without changing the circuit component values or the switch duty ratio, the switch voltage will begin to increase again before the switch turn-on time. Then there can be substantially more than the optimum zero volts across the switch at turn-on time, causing energy to be lost in discharging C1 through the switch. The desired high-efficiency circuit operating conditions can be re-established by increasing the switch duty ratio so that it turns on earlier in the cycle, while the voltage is still at or near zero. Similarly, the duty ratio can be decreased to accommodate an increase in frequency in lieu of an adjustment of circuit element values.

4. Tuning a Load Which Is Not Substantially a Constant R, L, C

In some applications, the load 11, as presented to the output port of the load network 9, may not remain a substantially contact resistance in series with a substantially constant inductance and/or capacitance, across the frequency range to be tuned. In those cases, the adjustment of the circuit element values as a function of frequency must additionally take into account the variations in the load impedance as a function of frequency. For those cases, the element values for the network of this invention, are modified, at each frequency of interest, according to the values of L, C, and R of the load at those frequencies, for the particular load being driven. Then the tuning controls are so adjusted vs. frequency as to approximate substantially the required variations of inductance and/or capacitance with frequency. A general approach, which is applicable to all such cases, is to adjust the circuit element values vs. frequency substantially to meet the conditions of $V_{CE}=0$ and $dV_{CE}/dt=0$ at turn-on time, or to set $Q_L$ slightly higher than for that condition if it is desired to provide base turn-on current from the load as discussed previously.

5. Combinations of Tuning Methods

The various tuning methods described separately above may also be used in combinations. This permits more flexibility in accommodating a particular set of application conditions, frequency range, and load impedance range. Such combinations may easily be implemented, in the light of the foregoing disclosure, by those skilled in the art.

G. Modulation

The amplifier of the present invention may also be employed to provide an amplitude-modulated and/or phase-modulated output signal. Varying the switch duty ratio as described above for tuning purposes changes the power output as well as the tuning conditions. This may be used to provide amplitude modulation. Amplitude modulation may also be provided by varying the voltage of the $V_{CC}$ supply through well-known means. The phasing of the switch on and off transitions with respect to a fixed phase reference (such as a carrier-frequency master oscillator) may be used to provide phase modulation of the output. These and other modulation techniques, and their use in versatile high-accuracy high-efficiency modulation systems, are described in more detail in a concurrently pending application for Letters Patent of the United States entitled, "Amplifying and Processing Apparatus for Modulated Carrier Signals".

H. Power Oscillator

To those skilled in the art, it is apparent from the foregoing exposition that the amplifier can readily be converted to an oscillator by obtaining the signal for input 3 from the output of the active device switch or from the output of the load network or from an intermediate point in that network. The driver 2 need not then be a separate entity because the output of the amplifier provides the drive. In essence, the function of the driver means is performed by the amplifier when it is used as an oscillator. The input 3 of the active device therefore becomes part of the load on the amplifier when that apparatus is employed as an oscillator.

What we claim is:

1. In apparatus of the tuned switching type for the high-efficiency generation of alternating-current power, having A. an active device switch having a low-impedance on state and a high-impedance off state,
B. driver means for causing the switch to commute periodically between the two states,
C. a load network having an input port and an output port, said input port being connected in series with the switch,
D. a load coupled to the output port of the load network, and
E. means for supplying D.C. power to the series combination of the switch and the load network input port, the aforementioned elements being connected such that an inductive element is disposed in the D.C. path which extends to the switch from the means for supplying the D.C. power, and wherein the subcombination of the load network and the load includes
F. A damped resonant circuit, operative at least while the switch is in the off state, in which the damping is effected at least in part by the resistance of the load, said damped resonant circuit including
 1. at least one capacitive element whose capacitive reactance at the operating frequency is appreciable, and
 2. at least one inductive element whose inductive susceptance at the operating frequency is appreciable, the improvement wherein
 the values of the elements in the subcombination of the load and the load network are such that the voltage across the switch is substantially zero at the end of the off state, the voltage across the switch is substantially zero during the time the switch is in transition from the off state to the on state, and the time derivative of the voltage across the switch is substantially zero at the end of the off state.

2. The improvement according to claim 1, further characterized in that the combination of the load network and the load includes a circuit which is substantially an impedance-transform of the following circuit: disposed in parallel in the A.C. path across the switch are a first branch and a second branch, A. the first branch comprising the series combination of
 i. a resistive element of resistance R at the operating frequency,
 ii. an inductive element of inductance $$\frac{Q_L R}{\omega_o}$$

at the operating frequency,
 iii. a capacitive element of capacitance $$\frac{1+\frac{\left(\frac{D}{0.5}\right)^{-5.2}}{Q_L}}{\omega_o Q_L R}$$

B. the second branch comprising a capacitive element of capacitance $$\left(\frac{1+\frac{1}{Q_L}}{6.3\omega_o R}\right)\left(1.4e^{-17(D-0.5)^{2}}\right)$$

at the operating frequency, where
 a. $\omega_o=2\pi f_o$ is the operating frequency,
 b. $Q_L$ is a dimensionless constant, and
 c. D is the on duty ratio of the switch.

3. The improvement according to claim 1, further characterized in that the switch "on" duty ratio is substantially 50%, and that the subcombination of the load network and the load includes a circuit which is substantially an impedance-transform of the following circuit: disposed in parallel in the A.C. path across the switch are a first branch and a second branch, A. the first branch comprising the series combination of
 i. a resistive element of resistance R at the operating frequency,
 ii. an inductive element of inductance $$\frac{Q_L R}{\omega_o}$$

at the operating frequency,
 iii. a capacitive element of capacitance $$\frac{1+\frac{1}{Q_L}}{\omega_o Q_L R}$$

at the operating frequency, and
B. the second branch comprising a capacitive element of capacitance $$\frac{1+\frac{1}{Q_L}}{6.3\,\omega_o R}$$

at the operating frequency, where
 a. $\omega_o=2\pi f_o$ is the operating frequency, and
 b. $Q_L$ is a dimensionless constant.

4. The improvement according to claim 1, wherein the A.C. input admittance of the subcombination of the load network and the load, measured at the input port of the load network, is substantially $$\frac{B_o}{G_o} = y\left[1 + Q_L^2\left(1 - \frac{1}{x}\right)^2\right] - Q_L\left(1 - \frac{1}{x}\right)$$

$$\frac{\frac{dG}{d\omega}}{G_o} = -\frac{2Q_L^2\left(1 - \frac{1}{x^2}\right)}{\omega_o\left[1 + Q_L^2\left(1 - \frac{1}{x}\right)^2\right]}$$

$$\frac{\frac{dB}{d\omega}}{G_o} = \frac{y\left[1 + Q_L^2\left(1 - \frac{1}{x}\right)^2\right] - Q_L\left(1 + \frac{1}{x}\right)\frac{1 - Q_L^2\left(1 - \frac{1}{x}\right)^2}{1 + Q_L^2\left(1 - \frac{1}{x}\right)^2}}{\omega_o}$$

where a. the A.C. admittance as a function of frequency is represented as $G(\omega)+jB(\omega)$, b. $G_o$ is $G(\omega_o)$, the value of $G(\omega)$ evaluated at the operating frequency $\omega=\omega_o=2\pi f_o$, c. $B_o$ is $B(\omega_o)$, d. the derivatives $dG/d\omega$ and $dB/d\omega$ are evaluated at the operating frequency $\omega=\omega_o$, e. $Q_L$ is a dimensionless constant, f. D is the on duty ratio of the switch, g. $x$ is defined as $$1 + \frac{\left(\frac{D}{0.5}\right)^{-5.2}}{Q_L},$$

and h. $y$ is defined as $$\left(\frac{1 + \frac{1}{Q_L}}{6.3}\right)\left(1.4e^{-17(D-0.36)^2}\right).$$

5. The improvement according to claim 4 wherein the switch on duty ratio is substantially 50% and a. $x$ is defined as $1+1/Q_L$, and b. $y$ is defined as $(1+1/Q_L)/6.3$.

6. The improvement according to claim 1 wherein the load network further includes means for storing electric charge, said means being disposed in the A.C. path across the active device switch, and the element values in the subcombination of the network load and the load are further such that when the switch is in transition from the on state to the off state, any substantial increase in voltage across the switch is delayed at least until the current through the switch has fallen to substantially zero.

7. The improvement according to claim 6, further characterized in that the combination of the load network and the load includes a circuit which is substantially an impedance-transform of the following circuit: disposed in parallel in the A.C. path across the switch are a first branch and a second branch, A. the first branch comprising the series combination of i. a resistive element of resistance R at the operating frequency, ii. an inductive element of inductance $$\frac{Q_L R}{\omega_o}$$

at the operating frequency, iii. a capacitive element of capacitance $$\frac{1 + \frac{\left(\frac{D}{0.5}\right)^{-5.2}}{Q_L}}{\omega_o Q_L R}$$

B. the second branch comprising a capacitive element of capacitance $$\left(\frac{1 + \frac{1}{Q_L}}{6.3\omega_o R}\right)\left(1.4e^{-17(D-0.36)^2}\right)$$

at the operating frequency, where a. $\omega_o=2\pi f_o$ is the operating frequency, b. $Q_L$ is a dimensionless constant, and c. D (is the on duty ratio of the switch.

8. The improvement according to claim 6, further characterized in that the switch on duty ratio is substantially 50%, and that the subcombination of the load network and the load includes a circuit which is substantially an impedance-transform of the following circuit: disposed in parallel in the A.C. path across the switch are a first branch and a second branch, A. the first branch comprising the series combination of i. a resistive element of resistance R at the operating frequency, ii. an inductive element of inductance $$\frac{Q_L R}{\omega_o}$$

at the operating frequency, iii. a capacitive element of capacitance $$\frac{1 + \frac{\left(\frac{D}{0.5}\right)^{-5.2}}{Q_L}}{\omega_o Q_L R}$$

at the operating frequency, and

B. the second branch comprising a capacitive element of capacitance $$\left(\frac{1 + \frac{1}{Q_L}}{6.3\ \omega_o R}\right)\left(1.4e^{-17(D-0.36)^2}\right)$$

at the operating frequency, where a. $\omega_o=2\pi f_o$ is the operating frequency, and b. $Q_L$ is a dimensionless constant.

9. The improvement according to claim 6, wherein the A.C. input admittance of the subcombination of the load network and the load, measured at the input port of the load network, is substantially $$\frac{B_o}{G_o} = y\left[1 + Q_L^2\left(1 - \frac{1}{x}\right)^2\right] - Q_L\left(1 - \frac{1}{x}\right)$$

$$\frac{\frac{dG}{d\omega}}{G_o} = -\frac{2Q_L^2\left(1-\frac{1}{x^2}\right)}{\omega_o\left[1+Q_L^2\left(1-\frac{1}{x}\right)^2\right]}$$

$$\frac{\frac{dB}{d\omega}}{G_o} = \frac{x\left[1+Q_L^2\left(1-\frac{1}{x}\right)^2\right]-Q_L\left(1+\frac{1}{x}\right)\frac{1-Q_L^2\left(1-\frac{1}{x}\right)^2}{1+Q_L^2\left(1-\frac{1}{x}\right)^2}}{\omega_o}$$

where a. the A.C. admittance as a function of frequency is represented as $G(\omega) + jB(\omega)$, b. $G_o$ is $G(\omega_o)$, the value of $G(\omega)$ evaluated at the operating frequency $\omega=\omega_o=2\pi f_o$, c. $B_o$ is $B(\omega_o)$, d. the derivatives $dG/d\omega$ and $dB/d\omega$ are evaluated at the operating frequency $\omega=\omega_o$, e. $Q_L$ is a dimensionless constant, f. D is the on duty ratio of the switch, g. $x$ is defined as $$1+\frac{\left(\frac{D}{0.5}\right)^{-3.2}}{Q_L},$$

and h. $y$ is defined as $$\frac{\left(1+\frac{1}{Q_L}\right)}{6.3}\left(1.4e^{-17(D-0.366)^2}\right).$$

10. The improvement according to claim 9 wherein the switch on duty ratio is substantially 50% and a. $x$ is defined as $1+1/Q_L$, and b. $y$ is defined as $(1+1/Q_L)/6.3$.

* * * * *

UNITED STATES PATENT OFFICE

CERTIFICATE OF CORRECTION

Patent No. 3,919,656 Dated November 11, 1975

Inventor(s) Nathan O. Sokal; Alan D. Sokal

It is certified that error appears in the above-identified patent and that said Letters Patent are hereby corrected as shown below:

Column 1, following line 12, insert subheading --B. Multiple-Resonator Tuned Amplifier--
Column 1, line 68 change "80" to --80%--
Column 2, line 5 change "80" to --80%--
Column 4, line 53 change "concenpt" to --concept--
Column 6, line 35 place quotation marks around "the switch"
Column 7, line 35 insert hyphen between "output" and "port"
Column 7, line 36 insert hyphen between "on" and "state"
Column 7, line 39 insert hyphen between "current" and "source"
Column 8, line 36 change the word "an" to --a--
Column 8, line 63 change "impedence" to --impedances--
Column 9, line 33 change "imput" to --inputs--
Column 10, line 4 insert hyphen between "switching" and "mode"
Column 10, line 9 change "netowrk" to --network--
Column 10, line 37 change "principle" to --principal--
Column 11, line 1 change "FIG." to --FIGS.--
Column 11, line 45 insert hyphen between "quarter" and "wave-length"
Column 12, line 54 before "switch" insert --the--
Column 13, line 26 change the semicolon to a colon
Column 13, line 38 change "carrier" to --carries--
Column 14, line 2 place a colon after "follows", and delete the hyphen at the end of the line
Column 14, line 34 insert hyphen between "harmonic" and "frequency"
Column 18, line 32 insert hyphen between "too" and "low"
Column 18, line 47 change "beings" to --begins--
Column 18, line 61 "5" should be standard face, not boldface
Column 18, line 68 change "The" to --For the case of the transistor being on for 50% of the cycle, the--

Column 20, equation (1) restore parentheses in denominator of second term, viz.

$$\overline{3(\frac{\pi^2}{4} + 1)\ (1 + \frac{1}{QL})}$$

Column 21, equation (4) usual size numeral "1" (not subscript) at beginning of equation, viz. $\eta_c = 1-(\ldots)$ Column 23, line 2 change "$n_1 = n_2 1$" to --$n_1 = n_2 = 1$--

Column 23, line 28 change "illustrated" to --illustrate--
Column 23, line 29 change "will" to --which--
Column 24, line 57 change "well-Known" to --well-known--
Column 25, equation (10) place a slash in third term between $(\frac{f_M}{f})$ and $Q_M$, viz.

$$\frac{1}{f}\ (1 + (\frac{f_M}{f})/Q_M)\ (\frac{1}{2\pi^2 R\ 6.3})$$

Column 22, line 57 change "through which must be supplied $C_{ob}$" to --which must be supplied to $C_{ob}$--

Column 15, line 54 insert a comma after the word "as"
Column 26, line 5 after the word "set" add --properly--
Column 26, line 31 change "contact" to --constant--
Column 27, lines 38-43 "the aforementioned ..." starts a new line and is positioned at the extreme left margin.
Column 28, lines 21-24 subscript "2" squares (D-0.36), viz.

$$\ldots\ e^{-17\ (D-0.36)^2}$$

Column 29, line 55 change "network load" to --load network--
Column 30, line 29 delete parenthesis after "D"
Column 30, lines 47-50 change the equation to $\dfrac{1 + \frac{1}{QL}}{\omega_o Q_L R}$ Column 30, lines 54-57 change the equation to $$\frac{1 + \frac{1}{Q_L}}{6.3\omega_o R}$$

Signed and Sealed this

Twenty-second Day of February 1977

[SEAL]

*Attest:*

RUTH C. MASON
*Attesting Officer*

C. MARSHALL DANN
*Commissioner of Patents and Trademarks*